(12) United States Patent
Rinaldi et al.

(10) Patent No.: US 11,557,449 B2
(45) Date of Patent: *Jan. 17, 2023

(54) ZERO POWER PLASMONIC MICROELECTROMECHANICAL DEVICE

(71) Applicant: Northeastern University., Boston, MA (US)

(72) Inventors: Matteo Rinaldi, Boston, MA (US);
Zhenyun Qian, Boston, MA (US);
Sungho Kang, Boston, MA (US);
Vageeswar Rajaram, Boston, MA (US)

(73) Assignee: Northeastern University, Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/866,745

(22) Filed: May 5, 2020

(65) Prior Publication Data

US 2020/0335294 A1 Oct. 22, 2020

Related U.S. Application Data

(63) Continuation of application No. 15/753,059, filed as application No. PCT/US2016/048083 on Aug. 22, 2016, now Pat. No. 10,643,810.

(Continued)

(51) Int. Cl.
*H01H 37/00* (2006.01)
*H01L 31/0224* (2006.01)
(Continued)

(52) U.S. Cl.
CPC .......... *H01H 37/00* (2013.01); *B81B 3/0029* (2013.01); *H01H 37/02* (2013.01); *H01H 37/10* (2013.01);
(Continued)

(58) Field of Classification Search
CPC  B81B 3/0029; B81B 2201/018; H01H 37/72; H01H 37/64; H01H 37/10;
(Continued)

(56) References Cited

U.S. PATENT DOCUMENTS 2,682,594 A * 6/1954 Huetten ................. H01H 50/54
200/246
4,330,168 A * 5/1982 Arnold ................... H01R 4/183
439/877

(Continued)

FOREIGN PATENT DOCUMENTS

WO         2015109678 A1    7/2015

*Primary Examiner* — Anatoly Vortman
(74) *Attorney, Agent, or Firm* — Verrill Dana, LLP

(57) ABSTRACT

A zero-power plasmonic microelectromechanical system (MEMS) device is capable of specifically sensing electromagnetic radiation and performing signal processing operations. Such devices are highly sensitive relays that consume no more than 10 nW of power, utilizing the energy in detected electromagnetic radiation to detect and discriminate a target without the need of any additional power source. The devices can continuously monitor an environment and wake up an electronic circuit upon detection of a specific trigger signature of electromagnetic radiation, such as vehicular exhaust, gunfire, an explosion, a fire, a human or animal, and a variety of sources of radiation from the ultraviolet to visible light, to infrared, to terahertz radiation.

12 Claims, 20 Drawing Sheets

Related U.S. Application Data

(60) Provisional application No. 62/207,545, filed on Aug. 20, 2015.

(51) Int. Cl.

| | | |
|---|---|---|
| *H01H 61/013* | (2006.01) | |
| *H01H 37/02* | (2006.01) | |
| *H01H 37/10* | (2006.01) | |
| *H01H 37/46* | (2006.01) | |
| *H01H 37/64* | (2006.01) | |
| *H01H 37/72* | (2006.01) | |
| *B81B 3/00* | (2006.01) | |
| *H01H 61/00* | (2006.01) | |
| *H01H 37/32* | (2006.01) | |

(52) U.S. Cl.
CPC ............ *H01H 37/46* (2013.01); *H01H 37/64* (2013.01); *H01H 37/72* (2013.01); *H01H 61/013* (2013.01); *H01L 31/0224* (2013.01); *B81B 2201/018* (2013.01); *H01H 2037/008* (2013.01); *H01H 2037/326* (2013.01); *H01H 2061/006* (2013.01)

(58) Field of Classification Search
CPC ...... H01H 37/00; H01H 37/46; H01H 61/013; H01H 37/02; H01H 2037/008; H01H 2037/326; H01H 2061/006; H01L 31/0224
USPC ........................................................ 337/298
See application file for complete search history.

(56) References Cited

U.S. PATENT DOCUMENTS

| | | | |
|---|---|---|---|
| 6,045,712 A | 4/2000 | Yarbrough et al. | |
| 6,392,233 B1* | 5/2002 | Channin | G01J 5/40 250/234 |
| 6,456,190 B1 | 9/2002 | Andersson et al. | |
| 6,525,307 B1* | 2/2003 | Evans, III | G01B 7/34 250/227.16 |
| 6,768,412 B2 | 7/2004 | Becka et al. | |
| 6,977,767 B2 | 12/2005 | Sarychev et al. | |
| 7,170,216 B2 | 1/2007 | Sanpei et al. | |
| 7,489,228 B2 | 2/2009 | Robert | |
| 7,580,175 B2* | 8/2009 | Aksyuk | G01J 5/40 250/338.1 |
| 7,705,307 B1* | 4/2010 | Zhao | G01J 5/0831 250/338.1 |
| 7,851,759 B2* | 12/2010 | Aksyuk | G01J 5/02 250/338.1 |
| 7,919,362 B2 | 4/2011 | Bolis | |
| 7,978,394 B1 | 7/2011 | Johnson et al. | |
| 8,026,485 B2* | 9/2011 | Mueller | G01J 5/40 250/338.1 |
| 8,314,445 B2 | 11/2012 | Rudenja et al. | |
| 8,450,690 B2 | 5/2013 | Averitt et al. | |
| 8,717,659 B2 | 5/2014 | Zheludev et al. | |
| 8,922,094 B2 | 12/2014 | Lopez et al. | |
| 9,291,507 B1* | 3/2016 | Wang | H01L 27/14618 |
| 2009/0093551 A1 | 4/2009 | Bhatia et al. | |
| 2011/0108838 A1 | 5/2011 | Kageyama | |
| 2014/0150560 A1 | 6/2014 | O'Brien et al. | |
| 2014/0175284 A1* | 6/2014 | Roh | G01J 5/20 250/338.4 |
| 2014/0217289 A1* | 8/2014 | Nam | G01J 5/023 250/339.01 |
| 2016/0216777 A1 | 7/2016 | Geiger et al. | |
| 2017/0126263 A1 | 5/2017 | Rinaldi et al. | |

* cited by examiner

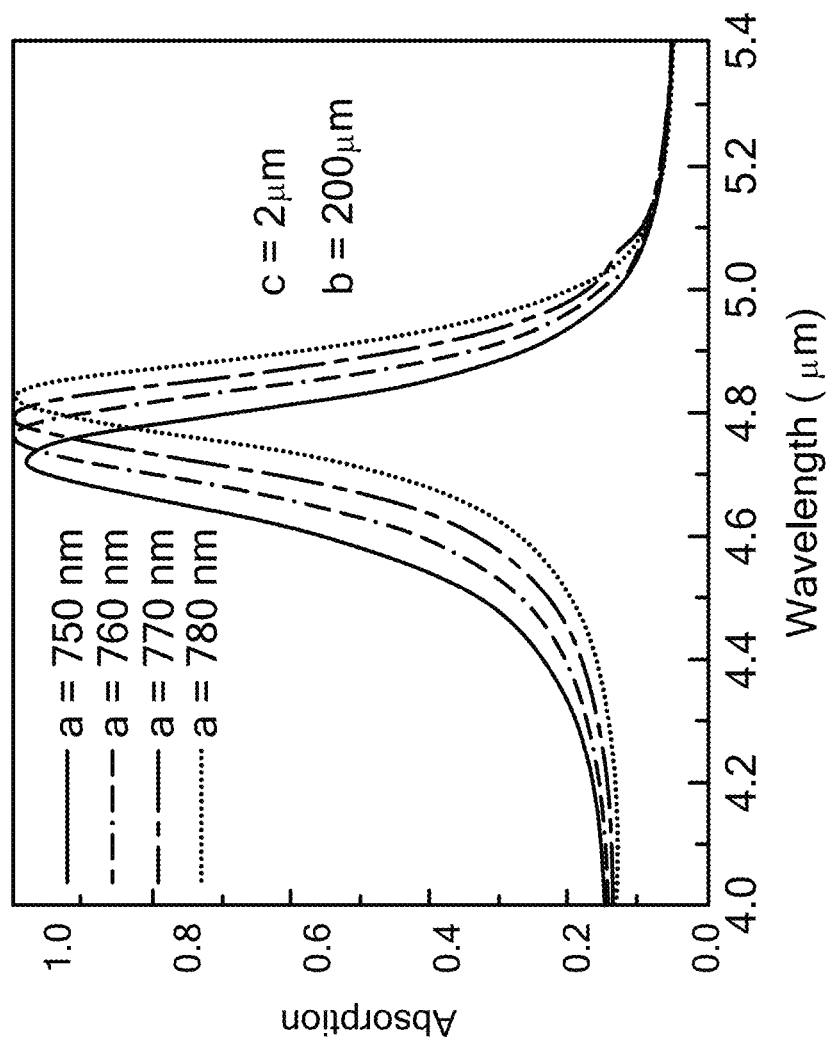
FIG. 6E
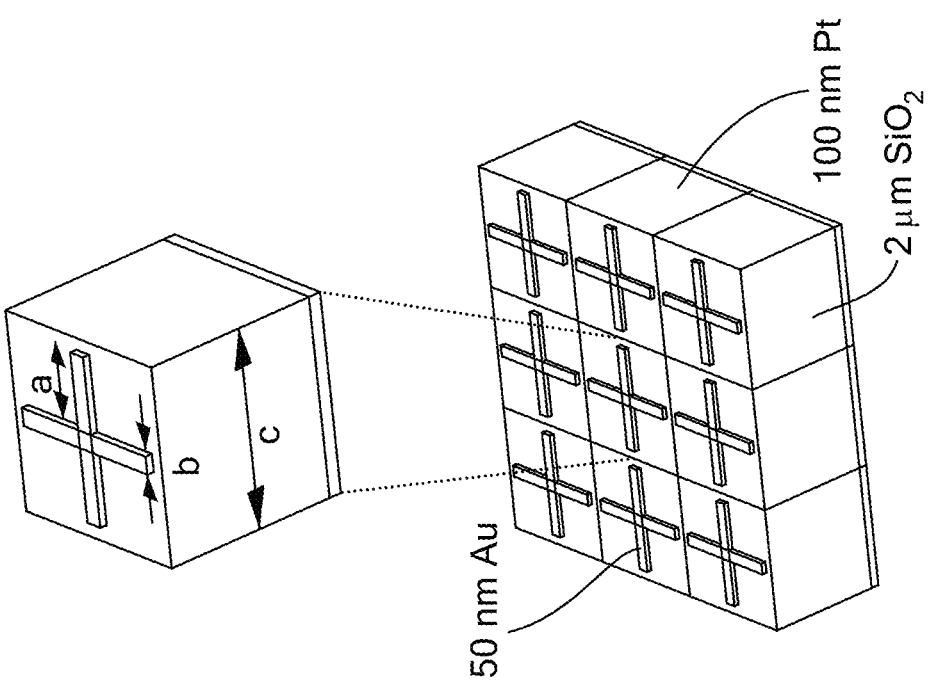
FIG. 6C
FIG. 6D

ZERO POWER PLASMONIC MICROELECTROMECHANICAL DEVICE

CROSS REFERENCE TO RELATED APPLICATIONS

This application is a continuation of U.S. application Ser. No. 15/753,059, filed 15 Feb. 2018 as the U.S. national phase of PCT/US2016/048083, filed 22 Aug. 2016, which claims the priority of U.S. Provisional Application No. 62/207,545 filed 20 Aug. 2015 and entitled "Zero-Power Plasmonic Microelectromechanical Infrared Digitizer". Each of the aforementioned applications is hereby incorporated by reference in its entirety.

STATEMENT REGARDING FEDERALLY SPONSORED RESEARCH OR DEVELOPMENT

The invention was developed with financial support from Grant No. HR0011-15-2-0048 from the Defense Advanced Research Projects Agency. The U.S. Government has certain rights in the invention.

BACKGROUND

Current state-of-the-art sensors use active electronics and require continuous power. However, there is a need for microelectromechanical devices such as sensors, switches, relays, and digitizers that operate under low power, zero power, or near zero power standby conditions, which allows them to be deployed for long-term or remote operation without the need for battery replacement or a power source.

SUMMARY OF THE INVENTION

The invention provides a zero-power plasmonic microelectromechanical system (MEMS) device capable of specifically sensing electromagnetic radiation and performing signal processing operations. Devices of the invention serve as highly sensitive relays, consuming no more than 10 nW of power, and have a low false positive rate. The device utilize the energy in detected electromagnetic radiation to detect and discriminate a target without the need of any additional power source. The devices can continuously monitor an environment and wake up an electronic circuit upon detection of a specific trigger signature of electromagnetic radiation. Devices of the invention can sense the presence or proximity of vehicular exhaust, gunfire, an explosion, a fire, a human or animal, and a variety of sources of radiation from the ultraviolet to visible light, to infrared, to terahertz radiation. Moreover, sensors using the devices can detect specific combinations of such radiation to identify unique targets.

One aspect of the invention is a zero-power plasmonic microelectromechanical relay. The relay includes a substrate and a first cantilever disposed on or within the substrate. The first cantilever includes a head, an inner pair of temperature-sensitive bimaterial legs, and an outer pair of temperature-sensitive bimaterial legs. The inner pair of legs are attached to opposite sides of the head, while the outer pair of legs are attached to the substrate and disposed adjacent to the inner pair of legs, forming first and second sets of inner and outer legs. The first and second sets of legs are disposed symmetrically on opposite sides of the head. The relay further includes a first thermal isolation region connecting the inner and outer legs of the first set of legs, and a second thermal isolation region connecting the inner and outer legs of the second set of legs. The relay also includes a top metal layer attached to the head which serves as a contact element. The position of the contact element determines whether the relay is in an ON or OFF state. The relay further includes a source electrical contact disposed on the surface of the substrate and a drain electrical contact disposed on the surface of the substrate, the drain contact separated from the source contact by a gap. In an embodiment, the head includes a plasmonic absorber that absorbs electromagnetic radiation within a spectral band selected for detection of a target. The absorption of electromagnetic radiation within the spectral band causes movement of the head, causing the contact element to move toward the source and/or drain contacts; when sufficient radiation within the selected spectral band impinges on the absorber, a conductive path is provided between source and drain contacts, and the associated circuit is closed.

An important feature of the relay is that the bimaterial legs each comprise a stack of at least two materials having different thermal expansion coefficients. This, and the design of the device, allow the legs to provide compensation for ambient temperature changes as well as for residual stress in the device from the fabrication process.

The relay is sensitive to electromagnetic radiation and can be switched from OFF to ON by as little as 100 nW of radiation in a vacuum and as little as 10 µW in air. The threshold can be adjusted to higher levels as desired, such as at least 200 nW, 500 nW, or 1, 2, 5, or 10 µW in a vacuum or at least 50, 100, 200, or 500 µW, or 1, 2, 3, 5, or 10 mW in air. The relay can undergo repeated cycling, such as 1 or more cycles, 10 or more, 100 or more, 500 or more, 1000 or more, 10000 or more 100000 or more, or 1000000 or more cycles without degradation of performance.

Another aspect of the invention is a device containing one or more relays as described above. The device can be, for example an exhaust gas detector, a living organism detector, a proximity sensor for a heat source or an organism, an infrared detector, a visible light detector, a color sensor, a spectrograph, or an electro-optical switch.

The invention can be further summarized by the following list of embodiments.

1. A zero-power plasmonic microelectromechanical relay comprising:
    a substrate;
    a first cantilever disposed on the substrate, the first cantilever comprising a head, an inner pair of temperature-sensitive bimaterial legs, and an outer pair of temperature-sensitive bimaterial legs, the inner pair of legs attached to opposite sides of the head, the outer pair of legs attached to a surface of the substrate and disposed adjacent to the inner pair of legs forming first and second sets of inner and outer legs, the first and second sets of legs disposed symmetrically on opposite sides of the head;
    a first thermal isolation region connecting the inner and outer legs of the first set of legs, and a second thermal isolation region connecting the inner and outer legs of the second set of legs;
    a top metal layer attached to the head which serves as a contact element, wherein position of the contact element determines whether the relay is in an ON or OFF state;
    a source electrical contact disposed on the surface of the substrate; and
    a drain electrical contact disposed on the surface of the substrate, the drain contact separated from the source contact by a gap;

wherein the head comprises a bottom metallic layer and a top insulating layer;

wherein the head further comprises a plasmonic absorber that absorbs electromagnetic radiation within a spectral band selected for detection, and the absorption of such electromagnetic radiation causes the contact element to move toward the source and/or drain contacts;

wherein the bimaterial legs each comprise a stack of at least two materials having different thermal expansion coefficients, the legs providing compensation for ambient temperature changes; and wherein absorption of said electromagnetic radiation by said plasmonic absorber causes the contact element to form an electrical connection between the source and drain contacts.

2. The relay of embodiment 1, further comprising a second cantilever disposed on the substrate adjacent to the first cantilever and with mirror symmetry to the first cantilever, the second cantilever comprising a head, an inner pair of temperature-sensitive bimaterial legs, and an outer pair of temperature-sensitive bimaterial legs, the inner pair of legs attached to opposite sides of the head, the outer pair of legs attached to a surface of the substrate and disposed adjacent to the inner pair of legs forming first and second sets of inner and outer legs, the first and second sets of legs disposed symmetrically on opposite sides of the head, the second cantilever further comprising a first thermal isolation region connecting the inner and outer legs of the first set of legs, and a second thermal isolation region connecting the inner and outer legs of the second set of legs; wherein the head of the second cantilever comprises a bottom metallic layer and a top insulating layer and does not comprise a plasmonic absorber; wherein the bimaterial legs of the second cantilever each comprise a bottom insulating layer and a top conductive layer, the legs providing compensation for ambient temperature changes; and wherein the bimaterial legs of the first cantilever and the bimaterial legs of the second cantilever provide similar temperature compensation.

3. The relay of embodiment 2, wherein the second cantilever head comprises a top metallic layer disposed on the insulating layer opposite the bottom metallic layer, wherein the top metallic layer functions as a broadband reflector.

4. The relay of embodiment 2, wherein the second cantilever head comprises an absorber that absorbs electromagnetic radiation over a different spectral band than that absorbed by the plasmonic absorber of the first cantilever head.

5. The relay of any of the preceding embodiments, wherein said ON state is characterized by existence of an electrical connection between the source and drain contacts, and said OFF state is characterized by the existence of no electrical connection between the source and drain contacts, and wherein the relay consumes less than 10 nanowatts of power in the OFF state.

6. The relay of embodiment 5 that exists in the ON state in the presence of said electromagnetic radiation and exists in the OFF state in the absence of said electromagnetic radiation, and is capable of repeatedly switching between said ON and OFF states solely based on the presence or absence of said electromagnetic radiation.

7. The relay of embodiment 6 that is capable of at least 500 cycles of switching between the ON and OFF states.

8. The relay of any of the preceding embodiments that can be switched from the OFF state to the ON state by less than 1 μW of said electromagnetic radiation in a vacuum and less than 3 mW of said electromagnetic radiation in air.

9. The relay of embodiment 5 that exists in the OFF state in the presence of said electromagnetic radiation and exists in the ON state in the absence of said electromagnetic radiation, and is capable of repeatedly switching between said OFF and ON states solely based on the presence or absence of said electromagnetic radiation.

10. The relay of any of the preceding embodiments, wherein said electromagnetic radiation is in the range from about 100 nm to about 3 mm in wavelength.

11. The relay of any of the preceding embodiments, wherein said electromagnetic radiation is infrared radiation.

12. The relay of any of the preceding embodiments, wherein said spectral band has a bandwidth in the range from about 0.5% to about 100% of a peak absorption wavelength.

13. The relay of any of the preceding embodiments, wherein said spectral band has a bandwidth of about 8% of a peak absorption wavelength.

14. The relay of any of the preceding embodiments, wherein said contact element comprises a bowl-shaped structure that forms said electrical connection between the source and drain contacts in an ON state.

15. The relay of any of the preceding embodiments, wherein the first cantilever head comprises a metamaterial plate having microscale length and width and nanoscale or microscale thickness, and wherein the plate comprises a metallic base layer, an insulating layer disposed on the metallic base layer, and one or more patterned metallic structures disposed on the insulating layer and designed to absorb electromagnetic radiation within said spectral band.

16. A device comprising a plurality of relays according to any of the preceding embodiments, wherein at least two of said relays absorb and are switched by different spectral bands of electromagnetic radiation.

17. The device of embodiment 16, wherein at least some of said plurality of relays are connected in series to detect simultaneous presence of a plurality of different spectral bands of electromagnetic radiation.

18. The device of embodiment 16 that utilizes a combination of serial and parallel connections of said plurality of relays.

19. The device of any of embodiments 16-18 that is capable of identifying a source of said electromagnetic radiation based on a spectral fingerprint of said radiation.

20. The device of any of embodiments 16-19, wherein one or more of said plurality of relays detects out-of-band electromagnetic radiation not produced by said source.

21. The device of embodiment 20, wherein the out-of-band electromagnetic radiation is black body radiation.

22. A device comprising one or more relays according to any of the preceding embodiments, wherein the device is selected from an exhaust gas detector, a living organism detector, a proximity sensor, an infrared detector, a visible light detector, a color sensor, a spectrograph, and an electro-optical switch.

23. A zero-power electrothermal microelectromechanical relay comprising:
   a substrate;
   a first cantilever disposed on the substrate, the first cantilever comprising a head, an inner pair of temperature-sensitive bimaterial legs, and an outer pair of temperature-sensitive bimaterial legs, the inner pair of legs attached to opposite sides of the head, the outer pair of legs attached to a surface of the substrate and disposed adjacent to the inner pair of legs forming first and second sets of inner and outer legs, the first and second sets of legs disposed symmetrically on opposite sides of the head;

a first thermal isolation region connecting the inner and outer legs of the first set of legs, and a second thermal isolation region connecting the inner and outer legs of the second set of legs;

a top metal layer attached to the head which serves as a contact element, wherein position of the contact element determines whether the relay is in an ON or OFF state;

a source electrical contact disposed on the surface of the substrate; and a drain electrical contact disposed on the surface of the substrate, the drain contact separated from the source contact by a gap;

wherein the head comprises a bottom metallic layer and a top insulating layer;

wherein the head further comprises an electric heater that is capable of heating the head and causing the contact element to move toward the source and/or drain contacts;

wherein the bimaterial legs each comprise a bottom insulating layer and a top metallic layer, the legs providing compensation for ambient temperature changes; and wherein a threshold amount of heat provided by said electric heater causes the contact element to form an electrical connection between the source and drain contacts.

24. The relay of embodiment 23, further comprising a second cantilever disposed on the substrate adjacent to the first cantilever and with mirror symmetry to the first cantilever, the second cantilever comprising a head, an inner pair of bimaterial legs, and an outer pair of bimaterial legs, the inner pair of legs attached to opposite sides of the head, the outer pair of legs attached to a surface of the substrate and disposed adjacent to the inner pair of legs forming first and second sets of inner and outer legs, the first and second sets of legs disposed symmetrically on opposite sides of the head, the second cantilever further comprising a first thermal isolation region connecting the inner and outer legs of the first set of legs, and a second thermal isolation region connecting the inner and outer legs of the second set of legs; wherein the head comprises a bottom metallic layer, a top insulating layer, and an electric heater that is capable of heating the head and causing the contact element to move toward the source and/or drain contacts; and wherein the bimaterial legs of the second cantilever each comprise a stack of two or more layers having different thermal expansion coefficients, the legs providing compensation for ambient temperature changes; and wherein the bimaterial legs of the first cantilever and the bimaterial legs of the second cantilever provide similar temperature compensation.

25. A microelectromechanical device comprising a bowl-shaped structure.

BRIEF DESCRIPTION OF THE DRAWINGS

FIGS. 6A-6E show modeling of a plasmonic metasurface. FIG. 6A presents an electromagnetic circuit model of a plasmonic metasurface. FIG. 6B shows measured and simulated absorption of a plasmonic metasurface with a=1.64 μm and b=313 nm. FIG. 6C shows a schematic representation of a unit cell of a plasmonic metasurface. FIG. 6D shows an IR absorbing metasurface of a PMR of the invention.

FIG. 6E shows a finite integration technique (FIT) simulated absorption of the plasmonic absorber of FIG. 6D.

DETAILED DESCRIPTION OF THE INVENTION

Figure 1:
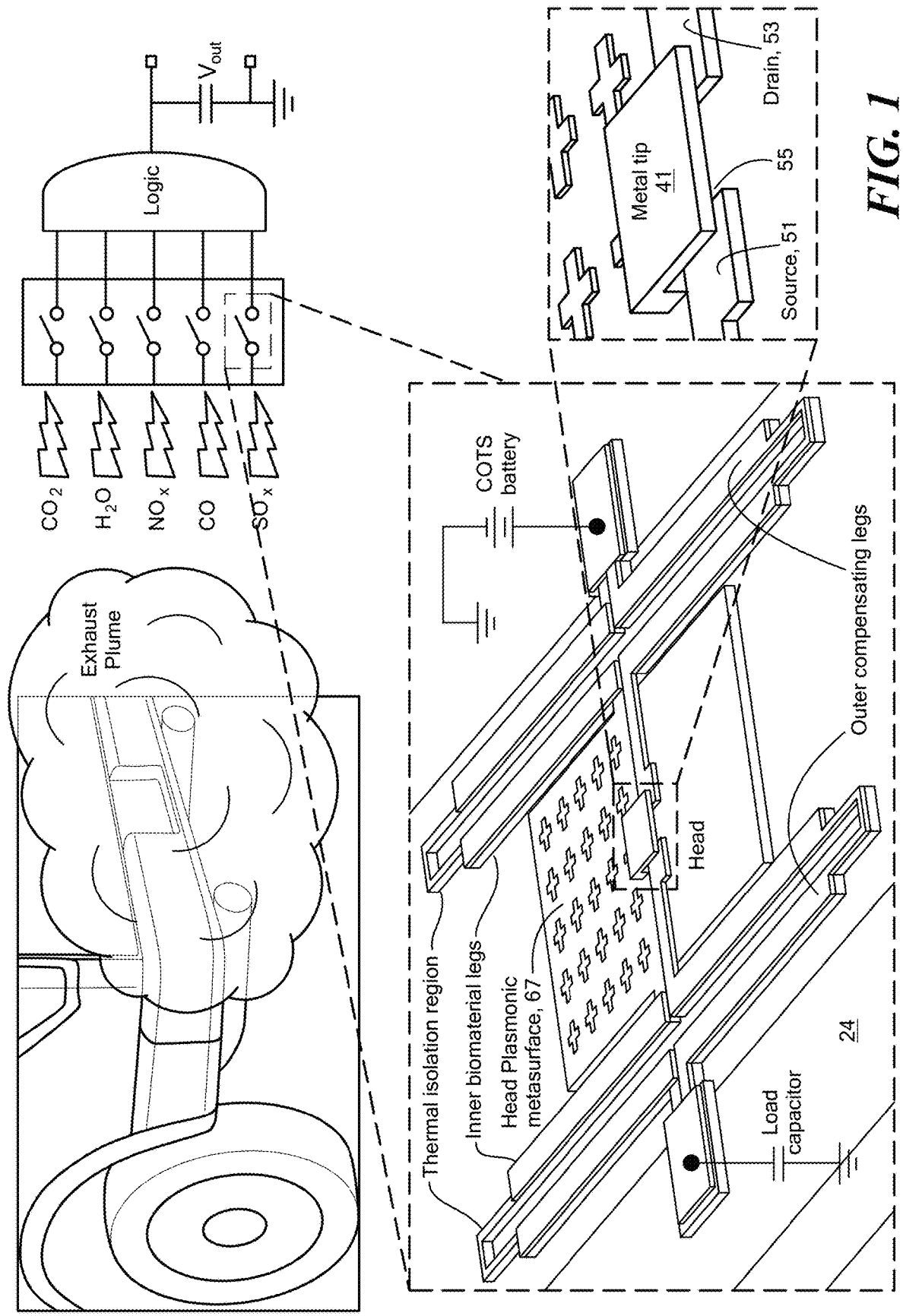
FIG. 1 shows a schematic illustration of an embodiment of a plasmonic microelectromechanical infrared digitizer of the invention. The zoomed-in views at the bottom of the figure show details of the plasmonically-enhanced MEMS relay.

The inventors have developed a zero-power plasmonic microelectromechanical system (MEMS) device that combines sensing, signal processing, and comparator functionalities into a single microsystem capable of producing a quantized output bit or serving as a relay in the presence of unique spectral signatures while consuming no more than 10 nW of power and maintaining a low false alarm rate. The device utilizes the energy in detected electromagnetic radiation to detect and discriminate a target without the need of any additional power source. The device is capable of continuously and passively monitoring an environment, and then waking up an electronic circuit upon detection of a specific trigger signature of electromagnetic radiation.

In an embodiment of the device, a plasmonically-enhanced MEMS relay (PMR) is selectively activated by impinging radiation at a specific spectral wavelength, and a conducting channel is created between source and drain metal contacts and a metal contact element. The radiation can be, for example, infrared (IR) radiation emitted from a target that is warmer than its environment. A thin plasmonic metasurface is used to form an IR-sensitive head of the PMR, which allows the whole device to behave as a spectrally selective IR ultrathin absorber (i.e., only the wavelength selected by the metasurface can activate the PMR). The device is sensitive, responding to an IR emission of less than 100 nW, and spectrally selective, having a full width at half maximum of <10%. It has a fast response time of <100 ms to close contacts upon exposure to IR radiation. The structure is completely immune to ambient temperature changes and residual stress thanks to an intrinsic compensation scheme. The PMRs integrate body-biased thin-film AlN piezoelectric unimorph actuators to achieve threshold tuning and complementary device operation. The device rejects background interference from other warm objects by using a passive logic circuit to connect the system battery to the load only when exposed to the target IR signature. The device thus combines near zero power consumption with high sensitivity and rejection of false positives.

A device of the invention has many possible uses. For example, it can be used as an unattended ground sensor that lasts for years and identified remote threats, such as vehicular pollution, gunfire, explosion, natural fire, and the like. It can be used as a miniaturized and zero-power combat identification trigger that remains covert unless illuminated by a friendly laser target designator. It can be used in wearable sensors that constantly monitor radiation levels of surroundings with zero-power consumption. Finally, a device of the invention can be employed as a zero-power sensor node for the Internet of Things.

In one embodiment of the device, an array of plasmonically-enhanced MEMS relays (PMRs) are connected to implement a passive logic circuit. The device separates the system battery from an output load capacitor. Each PMR, according to its design, is selectively triggered by impinging radiation at a specific spectral wavelength. When the anticipated spectral signature is absent, at ambient background conditions, the system battery is disconnected from the output load, resulting in a digital output voltage of <10 mV. However, when exposed to the target spectral signature (e.g., the exhaust plume of a vehicle), a specific combination of PMRs is activated, according to the implemented logic, connecting the system battery to the load capacitor which is charged to a voltage value of ≥1V, indicating positive detection of the target.

An infrared digitizer of the invention is shown schematically in FIG. 1. The device exploits the energy in heated gas molecules to detect and discriminate the presence of an exhaust plume of interest, while rejecting background interference from other warm objects, without the need of any additional power source, which directly translates into near-zero standby power consumption. These unique features have been achieved by MEMS, plasmonic, and microsystem design.

Figure 2:
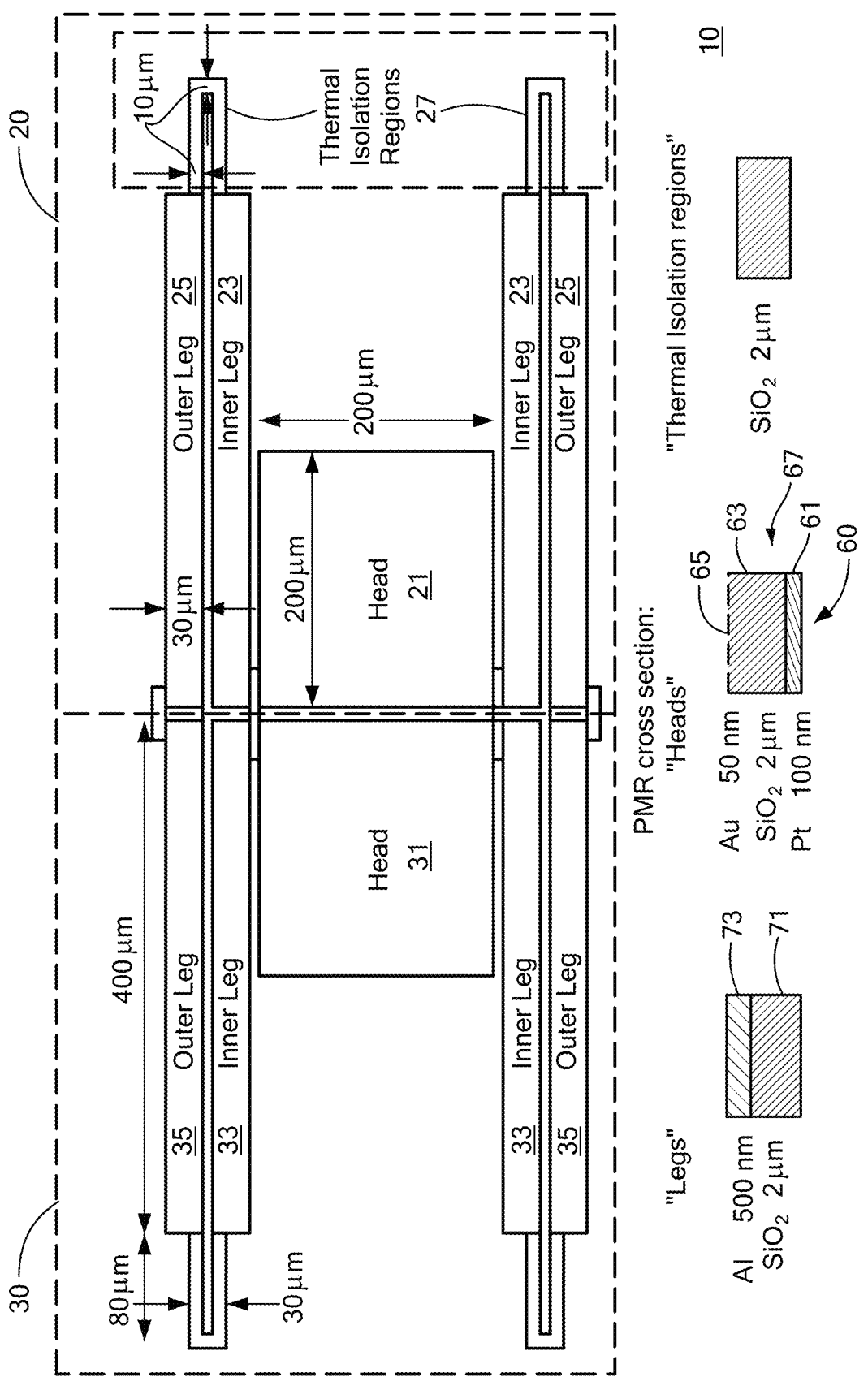
FIG. 2 is a top view illustration of a plasmonic MEMS relay device.

A core element of devices and systems of the invention is a MEMS relay, an embodiment of which is shown in FIG. 2. In some embodiments, the MEMS relay is a plasmonically activated MEMS relay (PMR), which is activated by impinging electromagnetic radiation within a specific spectral wavelength band. The absorbed power is used to create a conducting channel between two bottom contacting metals (source 51 and drain 53) and a top metal tip or layer 41. PMR 10 consists of two symmetric released cantilevers facing each other: first cantilever 20 and second cantilever 30. Each cantilever is composed of a head (21, 31); an inner, thermally sensitive pair of bimaterial legs (23, 33) (bottom insulating later (71) and top conductive layer (73)); an outer temperature and stress compensating pair of bimaterial legs (25, 35) connected to the substrate (24); and a pair of thermal isolation regions (27) between the bimaterial legs. The head of the second cantilever is composed of a metal-insulator-metal structure that reflects any impinging IR radiation (relatively thick top metal layer acts as a mirror). Source and drain contacts (bottom contacting metals of the PMR) are defined in the top metal layer of the head of the second cantilever and are electrically connected to the respective terminals on the substrate through the legs of the second cantilever structure (FIG. 1). The head of the first cantilever carries the electrically floating metal tip (top contacting metal, or contact element, of the PMR). The first cantilever head is composed of a metal-insulator-metal structure in which the top metal layer (65) is patterned to form an array of plasmonic nanostructures that enable strong absorption of IR radiation in the sub-wavelength structure (plasmonic absorber 67) ((see FIG. 1 and lower portion of FIG. 2 for cross-section (e.g. metamaterial plate 60 having bottom metallic layer or metallic base layer 61, top insulating layer 63, patterned metallic structures 65)).

When an IR beam impinges on the device from the top, it is selectively absorbed by the plasmonic head of the first cantilever, leading to a large and fast temperature increase of the freestanding micromechanical structure (i.e., head and inner leg portions) up to the two thermal isolation regions, where the high thermal resistivity of the insulator material (e.g., $SiO_2$) links the inner and outer legs and prevents heat transfer to the outer legs and the substrate, see FIGS. 1 and 2). Such an IR-induced temperature rise results in a downward bending of the first cantilever's thermally sensitive pair of bimaterial legs due to the in-plane thermal stress caused by the large difference in the thermal expansion coefficients of the two materials forming each leg (e.g., 2 μm thick $SiO_2$ as the insulating layer and 500 nm thick Al as the metallic layer). This thermally-induced bending translates into vertical displacement of the first cantilever head. On the other side, the first cantilever's outer compensating pair of bimaterial legs as well as the entire second cantilever do not experience any temperature variation upon exposure to IR radiation (FIG. 3). Therefore, the air gap (55) separating the bottom drain/source contacts patterned on the head of the second cantilever from the top metal tip on the head of the first cantilever is directly controlled by the impinging IR radiation through a plasmonically-enhanced thermomechanical coupling. When the power of the IR radiation exceeds the designed threshold, the PMR is activated, and the top metal tip is brought into contact, shorting the source and drain contacts allowing current to flow from the system battery to the load. Despite the intrinsically high sensitivity of the PMR to IR-induced heat, the structure is completely immune to ambient temperature changes; both the inner and outer pairs of the legs supporting the two cantilevers bend in the same direction, thus minimizing any ambient temperature induced motion of the cantilever heads. Similarly, any mechanical bending of the cantilever legs due to residual stresses associated with the fabrication process is also minimized. Any residual ambient temperature and/or stress-induced deflections of the two cantilevers are compensated by the symmetry of the structure; because both the cantilevers deflect in the same fashion, the designed gap dimension is preserved.

Figure 3A:
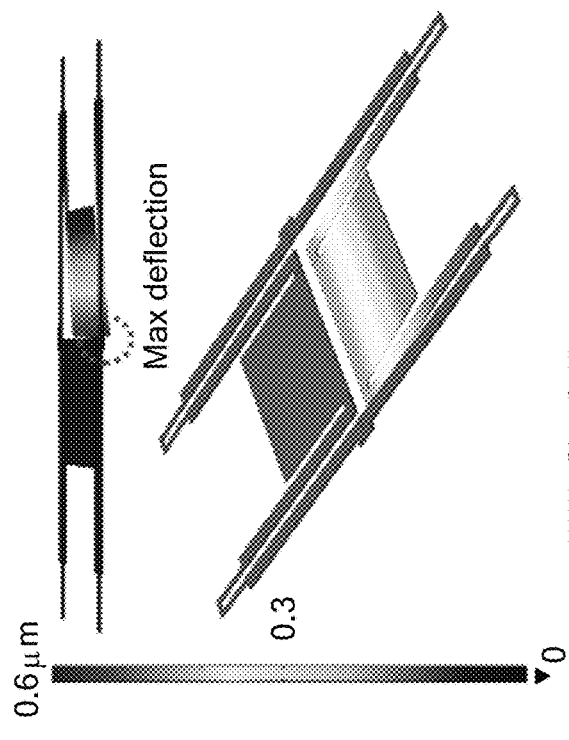
FIGS. 3A-3D show the results of finite element model (FEM) simulations for a plasmonic MEMS relay device.
Figure 3B:
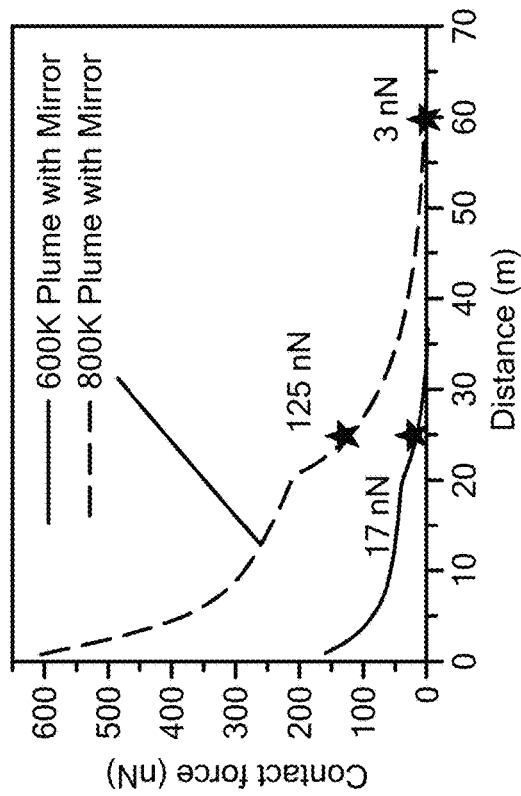
Figure 3C:
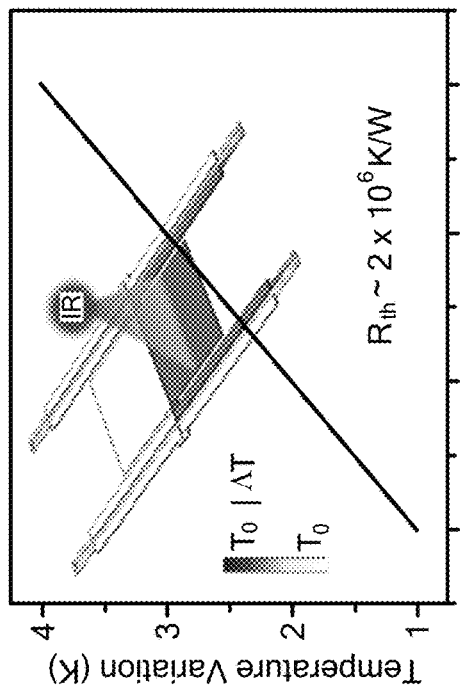
Figure 3D:
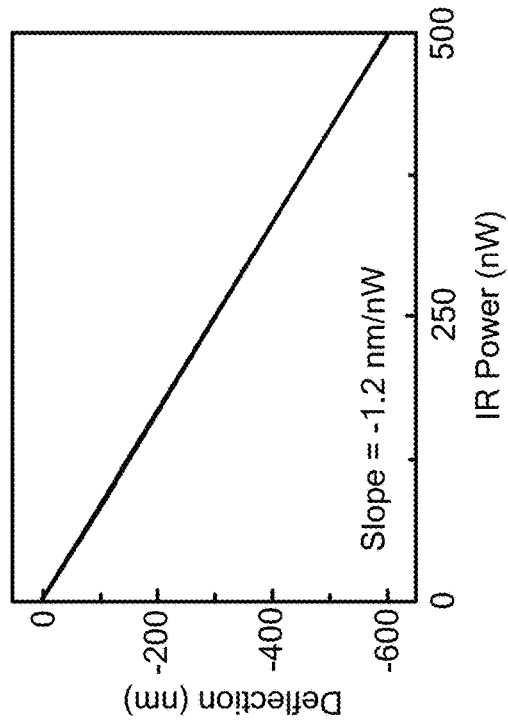

For the PMR embodiment shown in FIG. 2, the thermal resistance of the device was estimated using finite element model (FEM) simulations, considering the conductive and radiative heat transfer mechanisms (simulating the vacuum case). The FEM simulation estimated a thermal resistance of ~2×10$^{6}$ K/W for the structure (FIG. 3A), which is determined by the parallel combination of conductive (~4×10$^{6}$ K/W) and radiative (~4×10$^{6}$ K/W) thermal resistances. The FEM simulations also showed that a relatively large displacement of the PMR plasmonic head is achieved for smaller amounts of absorbed IR power (sensitivity ~1.2 nm/nW, FIGS. 3B, 3C). The structure spring constant was also estimated by FEM simulation and found to be ~25 mN/m. Therefore, an absorbed IR power of ~500 nW would be sufficient to close a ~500 nm gap with a restoring force at the contact of ~12.5 nN, which is large enough to overcome adhesion forces and re-open the contacts (reset the PMR) once the IR radiation is no longer present. Based on these FEM simulation results, the contact force was also calculated as a function of the distance between the plume (at two different temperatures) and the PMR, including atmospheric absorption effects and assuming a 150 mm diameter concave mirror is employed to focus the light onto the PMR (FIG. 3D).

Figure 4B:
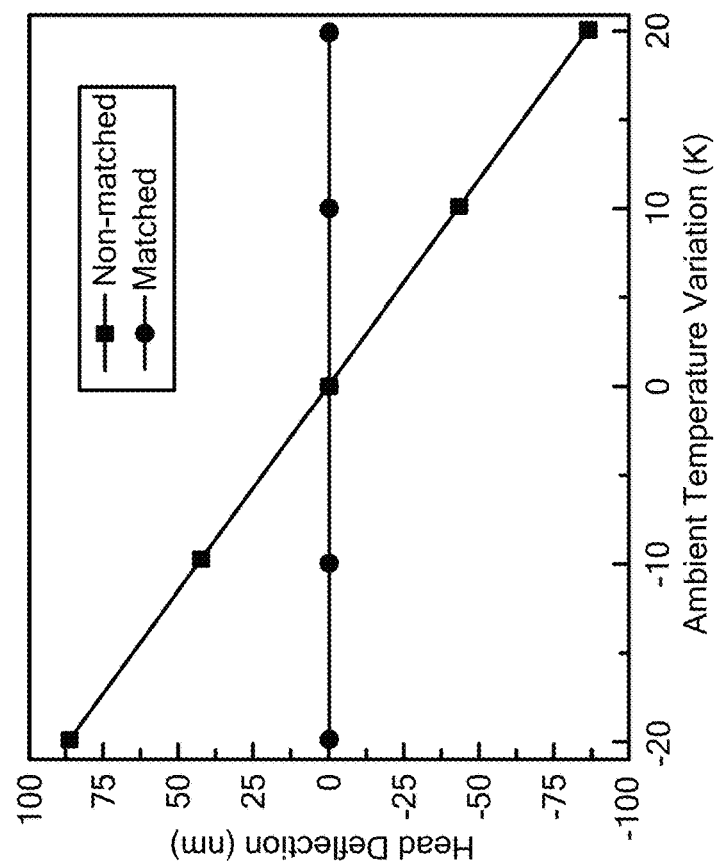
FIGS. 4A-4B show the results of 3D FEM simulations of the effect of temperature on cantilever head deflection.
Figure 4A:
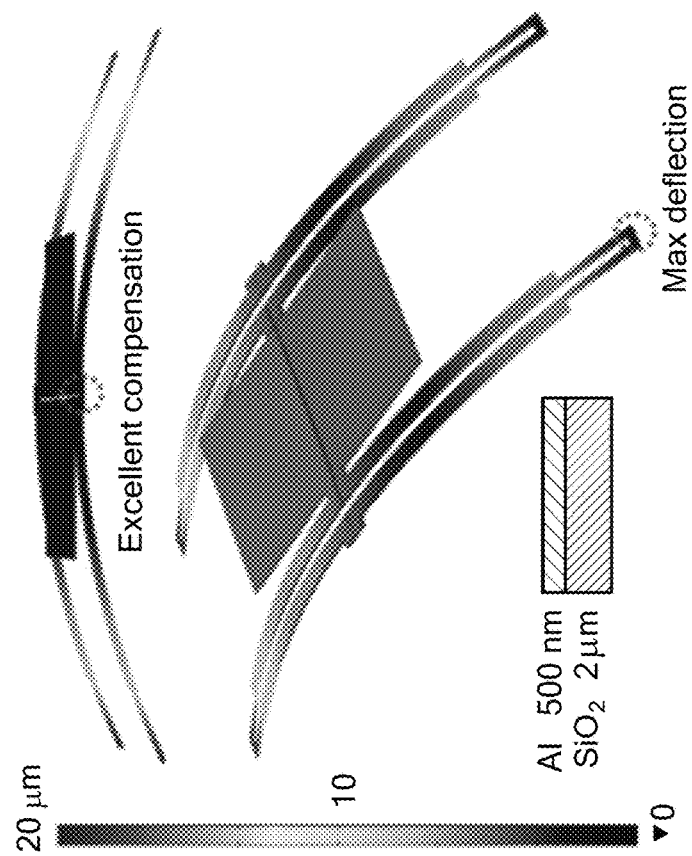

The PMR is intrinsically immune to ambient temperature variations if perfectly symmetric cantilever heads and legs are employed (FIG. 4A). However, the plasmonic structure patterned on the head of the first cantilever and the Al layer (used for electrical routing) deposited on top of the thermal isolation regions of the second cantilever can in principle deteriorate such a balanced condition. This effect was evaluated by 3D FEM simulation using COMSOL showing a gap sensitivity to ambient temperature variations of ~4.3 nm/° C. for such imperfectly matched cantilevers (FIG. 4B). Although such a small temperature sensitivity might be considered tolerable (since a relatively large gap of ~500 nm is employed), the deflection mismatch between the two heads can potentially be canceled by patterning a highly reflective thermal matching layer (e.g., a gold patch) on the head of the second cantilever to match the deflection of the head of the first cantilever. For example, FEM simulations showed that a highly reflective 118 µm×118 µm Au patch, patterned on the head of the second cantilever is sufficient to reduce the gap sensitivity to temperature to ~0.02 nm/° C. (FIG. 4B). Such intrinsic immunity to ambient temperature and residual stress is highly beneficial for the implementation of normally open (NO) PMRs with design determined IR threshold values (designed gap is preserved after fabrication). Nevertheless, by properly engineering an asymmetry in the structure (i.e., by acting on the material and the geometry of the thermal matching layer patterned on the head of the second cantilever, either at the layout level and/or by trimming after fabrication) it is possible to fabricate high performance normally closed (NC) PMRs requiring only a small amount of restoring force, hence a low amount of absorbed IR power, to overcome the stress asymmetry in the beams (in addition to surface adhesion) and switch to an open state.

Figures 5A, 5B:
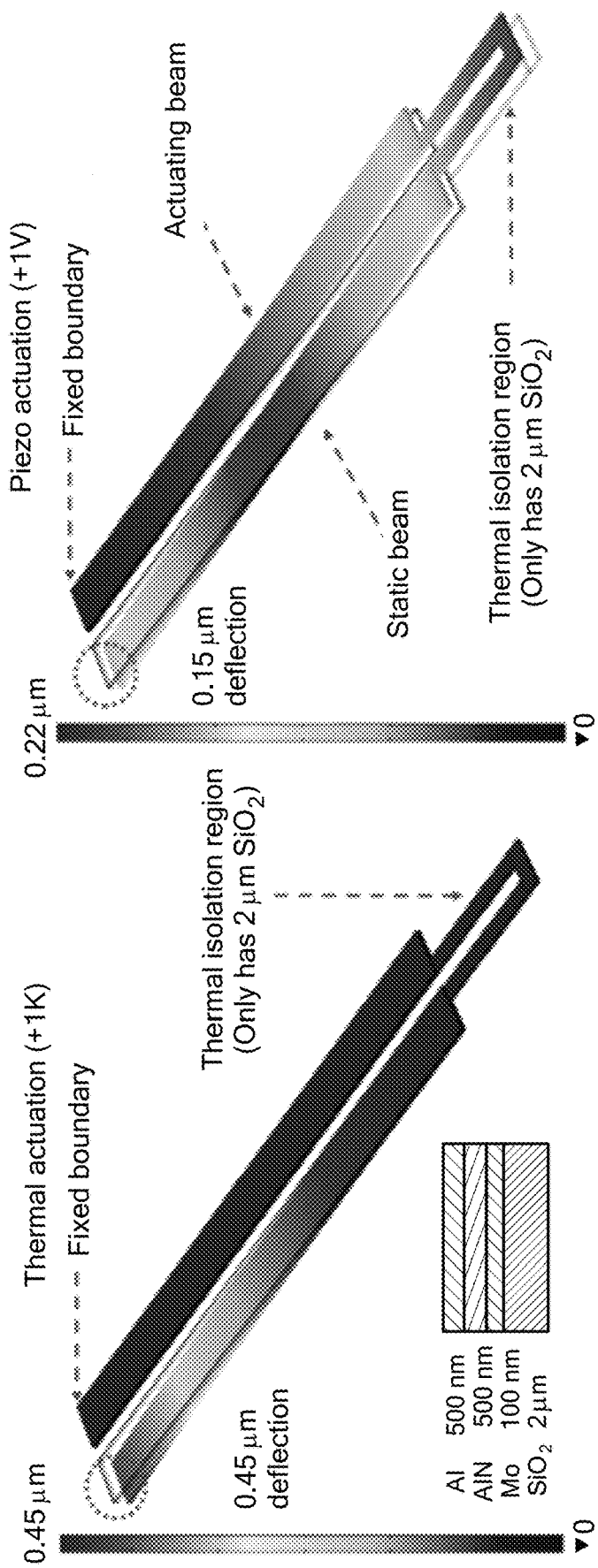
FIGS. 5A-5B depict an embodiment of a plasmonic MEMS relay device integrated with piezoelectric unimorph actuators.

Threshold tuning and complementary device operation, using NO and NC PMRs, can be further facilitated by the introduction of body-biased thin-film aluminum nitride (AlN) piezoelectric unimorph actuators in the design of the structure (FIGS. 5A-5B), providing a multitude of advantages for the implementation of a sophisticated logic for improved IR signature discrimination. In an embodiment of the PMR integrated with piezoelectric unimorph actuators, thin layers of AlN (500 nm) and metal (molybdenum, 100 nm, to be used as the bottom electrode) are added over the inner and outer legs of the structure (sandwiched between the SiO$_2$ structural layer and the Al top metal electrode). Since the thermal isolation of the PMR is primarily determined by the dimensions of thermal isolation regions (conductive heat transfer) and the cantilever head area (radiative heat transfer), a high thermal resistance (~2×10$^{6}$ K/W) is preserved despite the introduction of the AlN and Mo layers on top of the PMR inner and outer legs. FEM simulations showed that: (i) a downward bending of the inner piezoelectric cantilever legs of ~450 nm is achieved for a head temperature variation of 1° K. (corresponding to ~500 nW of IR power absorbed in the cantilever head); and (ii) a displacement of ~150 nm is achieved at the tip of the inner piezoelectric leg (head displacement) when a 1 V bias is applied to the outer piezoelectric leg. Although the added piezoelectric layer makes the legs ~25% less sensitive to the IR induced temperature variation, trimming and reconfiguration of the PMR IR sensitivity and threshold can be achieved by controlling the size of the air gap with the applied bias; body-biasing of the piezoelectric actuator causes a pre-bending of the beams, enabling tuning of the device IR threshold by modulating the size of the initial contact gap, and providing the capability of configuring the device to be normally closed (i.e., by closing the contact with the applied body-bias and configuring the IR sensitive cantilever to deflect downwards to open the contact upon absorption of IR power). Despite the use of a body-bias, a near-zero leakage current can be achieved due to the excellent dielectric properties of the AlN, maintaining the overall power budget of the device at <10 nW.

The accuracy of such a threshold adjustment is fundamentally limited by the voltage stability of the battery employed to provide the bias, since a voltage regulator will not be employed, in order to preserve a 10 nW power budget. Commercially available 1.5 V lithium batteries (non-rechargeable primary cell) lose about 0.7% of their capacity per year when stored at room temperature (from the handbook of Energizer L91), which corresponds to a nominal voltage reduction of ~1.5 mV/year when the discharge current is close to zero. Furthermore, the capacity of such batteries is very stable within a wide range of ambient temperature variations (−40° C. to 60° C.) when the discharge current is small (<25 mA). Therefore, the effect of short-term temperature change on the output voltage of such batteries can be considered negligible. In the worst case scenario, if the batteries are stored at 40° C. for 10 years, they will lose ~30% of their capacity, and the open-circuit output voltage will decrease by ~4%. Therefore, the initial contact gap of the body-biased piezoelectric PMR can be designed to tolerate bias variations as large as ~5%. The contact size and initial gap of the PMR also can be designed to prevent the PMR from pulling in due to electrostatic forces. In order to avoid parasitic electrostatic source/drain actuation of the plasmonic head, the source/drain contact area and initial gap can be designed to guarantee a pull-in voltage larger than the maximum voltage applied between drain and source of the PMR (i.e., system battery voltage). For example, for the preliminary PMR design proposed here, a total source/drain contact area, A<10 µm$^2$ would guarantee a pull-in voltage, $V_{PI}$>8 V, significantly larger than the typical OFF state source-drain voltage value (~1V). The NO and NC PMR designs can be experimentally verified, and the design parameters including contact materials, contact force, surface adhesion, air gap, length of the legs, and thickness of the material stack can be accurately modeled and optimized to achieve an IR threshold ≤500 nW, a sub-threshold swing ≤10 pW/dec (expected ~9 orders of magnitude change in the drain-source current between ON and OFF states) and a number of switching cycles >10.

Figure 6A:
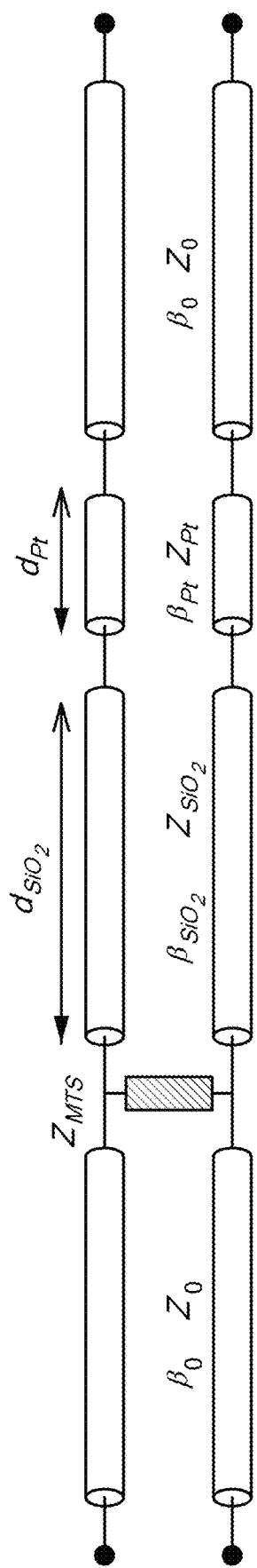
Figure 6B:
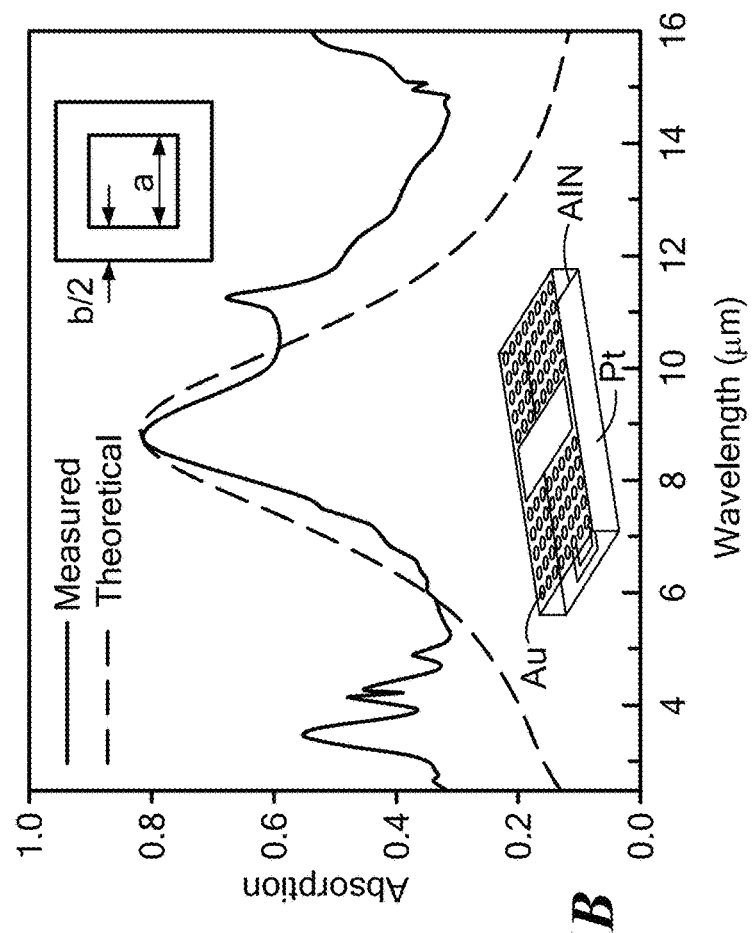

A fundamental requirement for the correct functionality of the plasmonically-enhanced MEMS relay described above is that the incident radiation at the target spectral wavelength is efficiently absorbed in the head of the first cantilever while the incident radiation at all the other frequencies is reflected. Although different kinds of IR absorbers can be integrated on top of the head of the cantilever, the resulting relatively thick material stack can negatively affect the mechanical and thermal response of the relay. Preferably, a thin plasmonic metasurface (~2 μm thick) is used to form the IR sensitive head of the PMR, which allows the whole device to behave as a spectrally selective IR ultrathin absorber. The metasurface can be composed of a thin dielectric (i.e. the 2 μm thick $SiO_2$ structural layer of the PMR) sandwiched between a bottom metal plate (i.e. 100 nm Pt) and a top metal layer (i.e. 50 nm Au) patterned to form an array of plasmonic nanostructures that enable strong and spectrally selective absorption of IR radiation in the sub-wavelength structure. Such a plasmonic metasurface can be modeled using a transmission-line approach (FIG. 6A). While a conventional longitudinal resonance would lead to a significant thickness, severely affecting the mechanical and thermal response of the resonator, in a preferred design the plasmonic metasurface is patterned on top of the grounded ultra-thin dielectric to have a large capacitive surface reactance. $X_s=-1/(\omega C_s)$. Stacked on top of a grounded slab, the dominant resonance is achieved when $X_s=-Z_0 \tan(\beta d)$, where $Z_0$ and $\beta$ are the characteristic impedance and propagation constants of the dielectric. Therefore, by tailoring the surface reactance of the plasmonic metasurface to be largely capacitive, it is possible to induce an ultrathin Fabry-Perot-like resonance in such a sub-wavelength structure. The inventors have experimentally demonstrated a 600 nm thick piezoelectric plasmonic metasurface (composed of a 500 nm AlN film sandwiched between a 100 nm bottom Pt plate and a 50 nm top metal layer patterned to form an array of plasmonic nanostructures) capable of absorbing ~80% of the impinging IR radiation for an optimized spectral band centered at ~8.8 μm (FWHM~1.5 μm) (FIG. 6A). Multiple metasurface geometries can be utilized in order to optimize absorption coefficient and FWHM at the spectral wavelengths of interest for plume IR signature detection. A plasmonic head design (compatible with the PMR discussed above), tuned to the emission band of $CO_2$ is shown in FIGS. 6C,6D. Full-wave simulations using the commercial software CST indicated that: (i) nearly 100% absorption can be achieved despite the sub-wavelength thickness of the structure; (ii) a narrow FWHM of ~5% can be attained; and (iii) by lithographically changing the geometrical dimension of the array of plasmonic nanostructures, absorption peaks at different IR spectral wavelengths can be readily obtained (FIG. 6E). Many metasurface structures are known which can serve as plasmonic absorbers. See, for example, Watts, C. M., Liu, X., & Padilla, W. J. (2012). Metamaterial electromagnetic wave absorbers. Advanced Materials, 24(23). (doi.org/10.1002/adma.201200674) and Cui, Y., et al. (2014). Plasmonic and metamaterial structures as electromagnetic absorbers. Laser and Photonics Reviews, 8(4), 495-520. (doi.org/10.1002/lpor.201400026).

The PMRs of the invention have a low IR threshold (≤100 nW) and very low contact forces, both when in contact and on retraction from contact, requiring contacts with low adhesion. Therefore, the adhesion force is an important contact design parameter. Conventional contact mechanics predict that to minimize adhesion for a given material, the contact point should have a small radius using a high hardness material with a small surface energy.

Theoretically, a larger radius contact (trending toward flat) exhibits more adhesion in a predictable manner. For nanometer radius contacts, the adhesion force can be in the nano-Newton range (nN). For conventional contacts, the overall design size of the contact is not very important, because it is the nanostructure that determines the contact radius, and therefore the contact area. Excess adhesion from hot switching is minimal because the voltage (less than a few volts) and current are limited by the circuit design, eliminating the possibility of arcing and minimizing the amount of heating and material transfer. With regard to resistance, even in a somewhat extreme case, where the contact radius is ~3 nm and the resistivity ~20 μΩ-m, the resistance would still only be ~3000Ω, which is adequate for the purposes of the PMRs of the present invention. Contact contamination is low as the system operates at low-pressure for thermal isolation.

Adhesion in MEMS/NEMS contacts covers an extremely wide range from less 1 nN (atomic force microscope) to tens or even hundreds of μN (low-resistance MEMS switches). To achieve ultra-low adhesion contacts, both the surface energy and the plastic deformation (at moderate contact pressures) are reduced compared to conventional MEMS contacts. The problem in a conventional contact is that the contact area increases with contact force (both applied force and adhesion force) due to plastic deformation of the contact material. In a conventional conducting material contact, a purely elastic contact is only observed for hard materials at low forces. In the case of at least some of the devices of the present invention, these conditions are likely to hold, and the contact adhesion is not expected to increase greatly over thousands or millions of contacts. Therefore, contacts can be prepared with small-radius asperities fabricated from hard refractory materials such as tungsten, ruthenium, or ruthenium oxide.

Figure 7A:
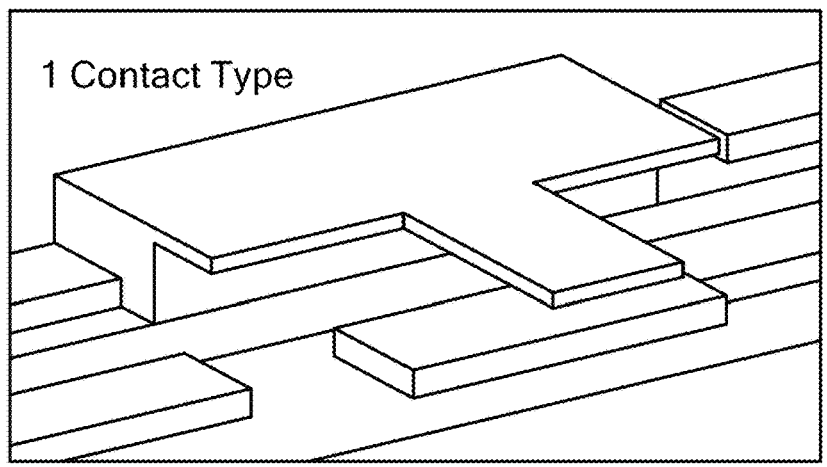
FIGS. 7A-7C show schematic representations of different switch contact element configurations.
Figure 7B:
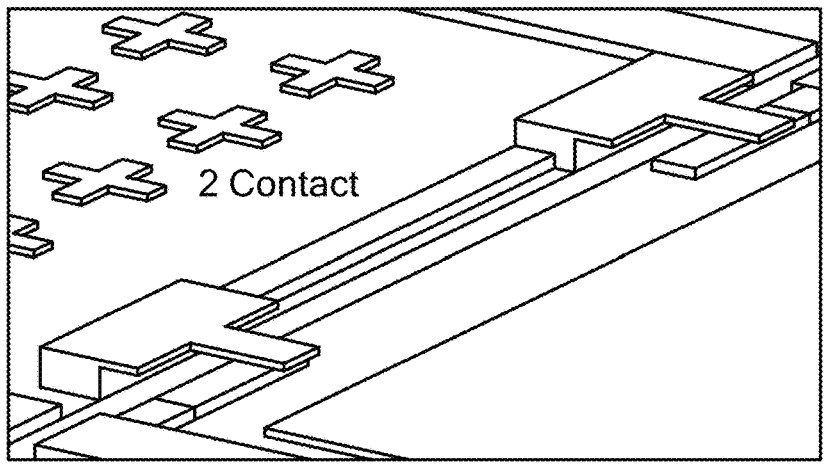
Figure 7C:
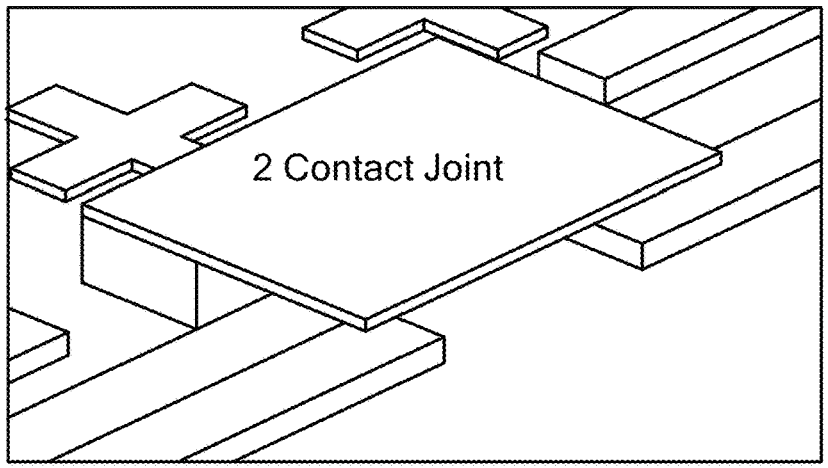

Several different switch designs are suitable for use in a PMR of the invention. FIGS. 7A-7C show three such designs. FIG. 7A shows a "1-contact" type, in which contact is made between the top metal contact element and one bottom metal contact. FIG. 7B shows a 2-contact type, in which two 1-contact type switches are used, connected by a conductive member. FIG. 7C shows a "2-contact joint" design in which a top contact element shorts two closely-spaced bottom contact terminals (source and drain). The 1-contact and the 2-contact designs are different mainly in the way the current flows through the switch. The 1-contact type requires a conductive path that travels from the source (V+) through the top metal layer (Al) in the bimaterial outer leg of the first cantilever (i.e., absorber side structures), the isolation region, the inner legs of the second cantilever, across the switch, through the inner legs of the second cantilever (the reflector side structures), the isolation region, and lastly the outer legs of the second cantilever to the drain (V−). Thus the current has to pass through half of each side. All tests in the Examples were done using the 1-contact configuration. The 2-contact configurations are different in that the current flows mostly through the second cantilever. This would mean that the absorbing side does not require the use of a metal on the thermal isolation region, which increases the thermal resistance and improves sensitivity. The 2-contact configurations also allow for further applications requiring low ON resistance, since the first cantilever is intrinsically compensating and the second cantilever can be entirely replaced by just two closely spaced fixed terminals, completely avoiding the long resistive path of the second cantilever.

The sensitivity (minimum power required to close the contact gap) can be tuned primarily by changing the length of the bimaterial legs. Longer legs improve sensitivity but reduce the stiffness required to overcome adhesion and turn OFF. Aluminum and $SiO_2$ can be used for the bimaterial legs to maximize sensitivity, since they have a large difference in thermal expansion coefficients and are CMOS process compatible. Other options to improve sensitivity are to reduce contact gap, to optimize the thickness ratio of the bimaterials, and to improve the thermal resistance of the thermal isolation regions by either using different materials or optimizing dimensions.

The stiffness of the contact tip is an important parameter for overcoming the adhesion of the contact. The stiffness of the relay has to be larger than the stiffness of the cantilever (which is about 0.05 N/m). The stiffness is a function of the length of the contact tip and material thickness, so the contact tip can be engineered to any stiffness. However, the use of bowl-shaped designs for the contact tip enables the maximum possible stiffness. By reducing the tip length by 4×, a 64× increase is obtained due to the inverse cubic dependence of stiffness on length. In general, the stiffness of the contact tip can range from about 0.05 N/m to about 1000 N/m, or from about 40 N/m to 1000s of N/m.

Figure 8A:
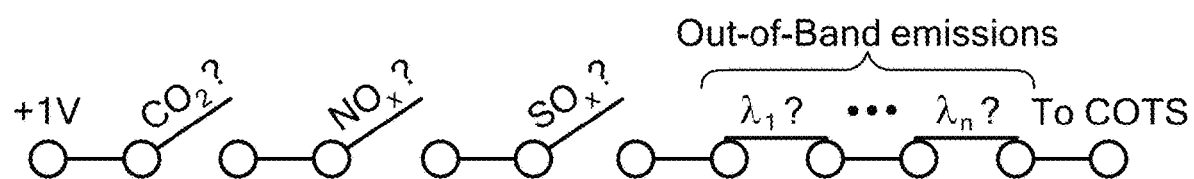
FIG. 8A shows a logic topology for the reduction of interference by non-target objects involving series connections of PMRs.

The false alarm rate can be minimized through the implementation of PMR logic topologies. Using such integrated passive hardware logic, the PMRs of the invention are capable of performing a spectral analysis of incoming IR radiation and detecting the presence of, for example, an exhaust plume of interest while rejecting background interference from other targets with different spectra. A logic topology, such as the one shown in FIG. 8A, employing a combination of normally open (NO) "in-band" PMRs (deigned to absorb IR wavelengths emitted by the target) and normally closed (NC) "out-of-band" PMRs (designed to absorb IR wavelengths that are not emitted by the target), can be implemented. If all the NO in-band PMRs and at least one of the NC out-of-band PMRs are activated, then the device will output a low logic bit '0'. If instead all the NO in-band PMRs but none of the NC out-of-band PMRs are activated, then the device will output a high logic bit '1'. Thanks to the minimal effect of the drain-to-source voltage on the actuation of each PMR (parasitic electrostatic force is minimized as explained above), the switching transients of an individual element will not electrically trigger adjacent devices.

Figure 8B:
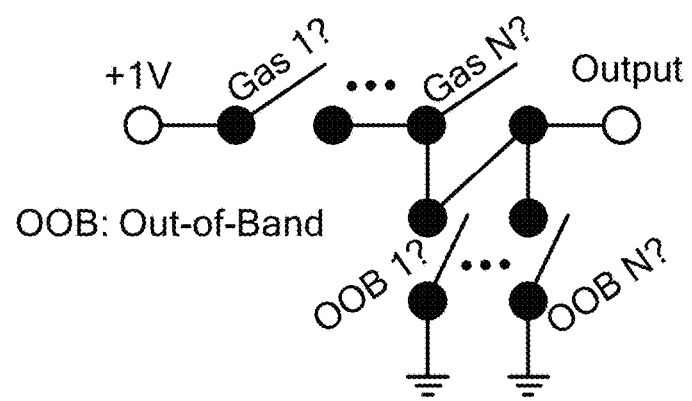
FIG. 8B shows a logic topology using a combination of series and parallel connections of PMRs.

Another logic topology involves a combination of series and parallel connections between PMRs. This can be employed to eliminate signals from hot objects that are not targets. Since a hot object emits across a large spectrum unlike a discretely emitting gas, there are certain wavelength regions where there are no gaseous emission bands and these are referred to as "out-of-band" (OOB) emissions. By connecting one terminal of PMRs sensitive to these out-of-band wavelengths to the output node (at the end of the series "in-band"/gas-sensitive PMRs) and the other to ground, it can be ensured that whenever the out-of-band signatures are present, the output is pulled down to the ground potential. This is represented in FIG. 8B.

Instead of connecting the OOB PMRs in parallel as described above, they can be intentionally made normally closed (NC) and connected in series to the in-band PMRs. The normally closed PMRs can be fabricated by intentionally having a small gap between the contacts such that adhesion forces dominate over the restoring force from the stiffness of the structure. With the right gap it is possible to engineer them to open on exposure to IR (note that here, the side with the bottom contact—the second cantilever—needs to have the plasmonic absorber too).

Another implementation of series-only topology is to detect both out-of-band (OOB) and in-band absorbers on a single PMR. For example, an OOB absorber can be placed on the head of the second cantilever while having an in-band absorber on the head of the first cantilever. When the OOB wavelengths are present, the OOB absorber head bends down, increasing the contact gap to effectively prevent closing of the switch. If both the OOB and in-band signals are present, both sides bend downwards, maintaining the contact gap and preventing the switch from closing. This allows for a small overall package while minimizing false detections. Other low power applications for PMRs:

PMR devices of the invention also can be used for visible light detection and color sensing. Since the device is entirely based on temperature rise of the head, it can be adapted to incorporate any type of absorber (broadband, black gold, Fabry-Perot layer stacks, and the like) on the head of the first cantilever. It also can be used to detect visible wavelengths of light, for example by using simple broadband absorbers with color filters for zero power color sensing. A device was tested in air for detection of visible light at 405 nm. The device used a plain gold layer (no plasmonic pattern) on the head of the first cantilever which intrinsically has ~60% absorption in the violet region. An ON threshold of ~3.5 mW was measured.

The devices also can be used as zero power PIR (passive IR) sensors. Such devices can be used in situations requiring low power human/animal/object detection in remote areas. Current PIR sensors typically use circuits that always consume a finite amount of power, requiring periodic battery replacements or constant power supply. Due to the high degree of temperature immunity, they can be used in virtually any kind of location, even outer space. The devices also can be used for zero power proximity sensing in smartphones, which currently use a near-IR LED and photodiode just above the screen to turn off the screen when a user brings the phone close to the ear when talking. The LEDs consume power and drain the already taxed battery. The PMRs of the invention can perform proximity detection without requiring an IR source apart from the heat of the human body. A similar logic topology to prevent false detections such as due to IR from the sun can be easily implemented. Use of the PMRs of the invention also can reduce the footprint of presently used circuits for IR detection, since the use of an LED and detector requires relatively large drive and sense circuits.

PMRs of the invention also can be employed in high reliability electro-optical switching and in fiber-optics-based communication given their high reliability and sensitivity. The ability to incorporate multiple narrow band wavelength sensing in a single package could tremendously improve speeds at low frequencies, since extra information in form of different wavelengths can be sent through the same path and detected by all PMRs in parallel with high immunity to cross talk between PMRs.

EXAMPLES

Example 1. Temperature Compensation in a Plasmonic MEMS Relay

Figure 9:
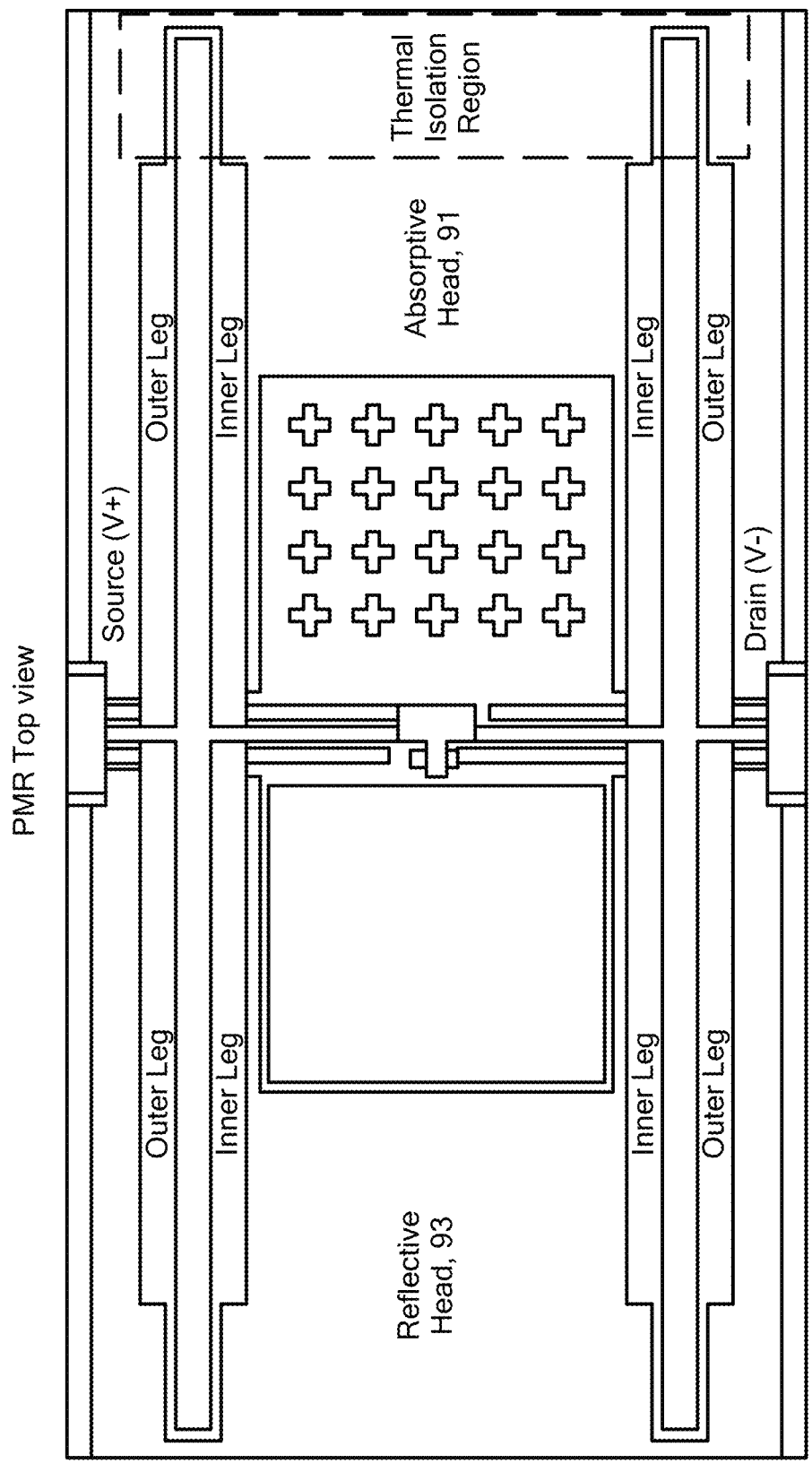
FIG. 9 shows a top view of a design for an IR-absorbing PMR.

A folded bimetal symmetric PMR structure was fabricated according to the design shown in FIG. 9. The device was based on a classic intrinsically compensating structure, wherein the absorptive head (91) with top contact and the reflecting head (93) with bottom contact have negligible relative movement due to ambient temperature change or stress. The thin isolation region contained the heat absorbed in the absorbing head within the inner pair of bimaterial legs. It should be noted that either side is intrinsically compensating to an extent, but to improve the compensation further and to add functionality, a mirrored structure was used.

Figure 10A:
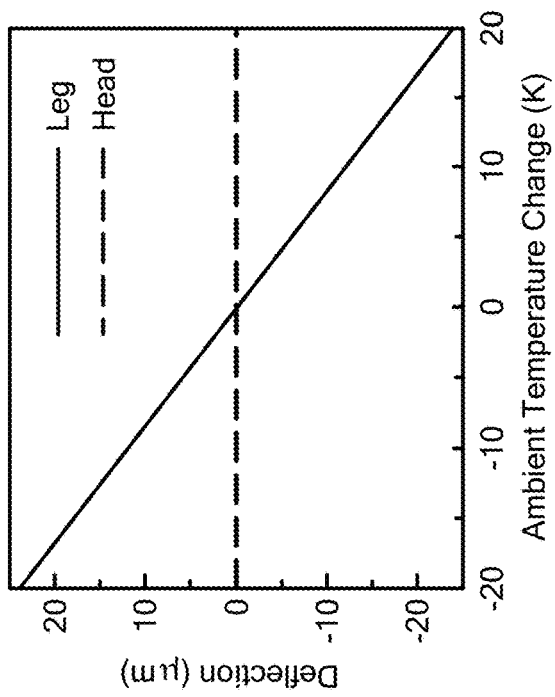
FIGS. 10A-10C show simulation results for temperature compensation in the PMR design of FIG. 9.
Figure 10B:
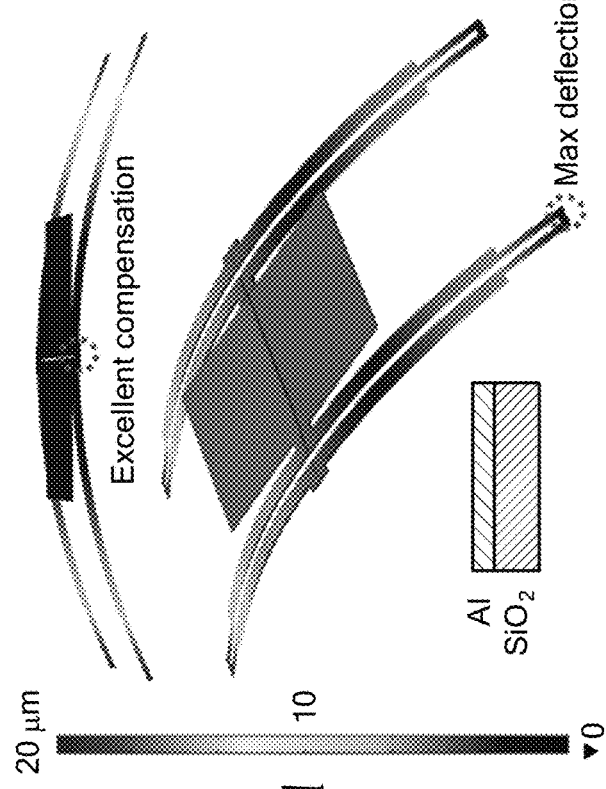
Figure 10C:
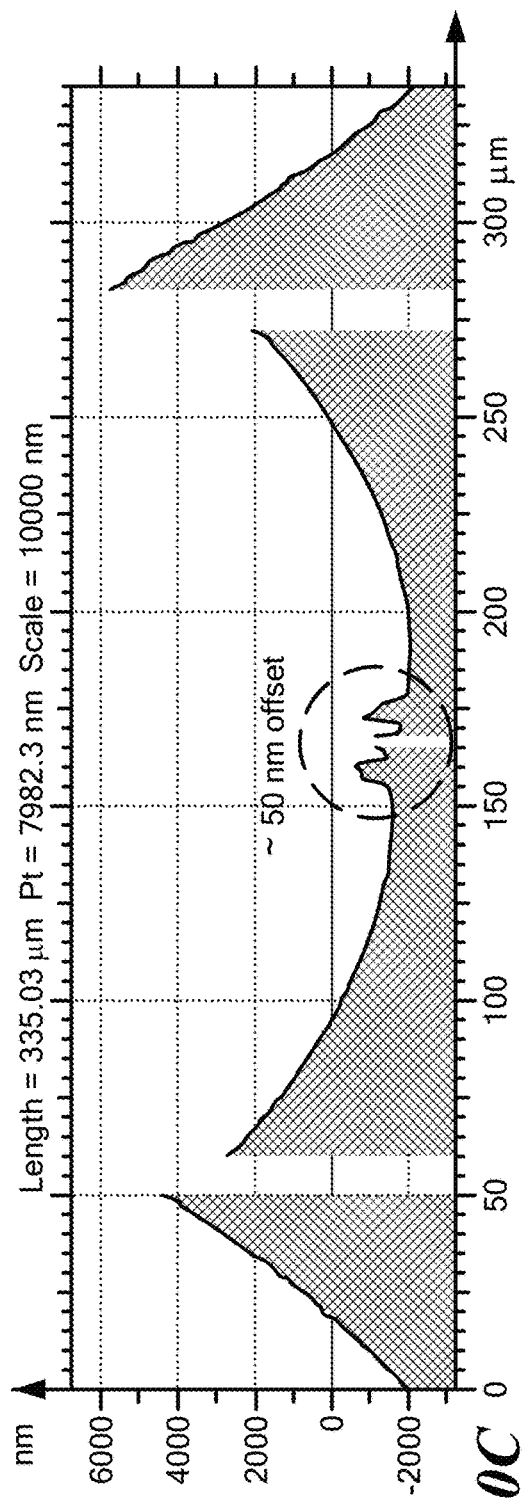

From the simulations and subsequent profilometer measurements as shown in FIGS. 10A-10C, the excellent compensation afforded by the structure was confirmed, with only ~50 nm offset between the top contact and bottom contact of the switch. Even though a large out-of-plane movement occurred in the simulation after release, there was predicted to be extremely low displacement at the contact region. This was further verified in a subsequent scanning electron microscope (SEM) image of the completed device (see below).

Example 2. Top Contact Design for Enhanced Strength

Figure 11A:
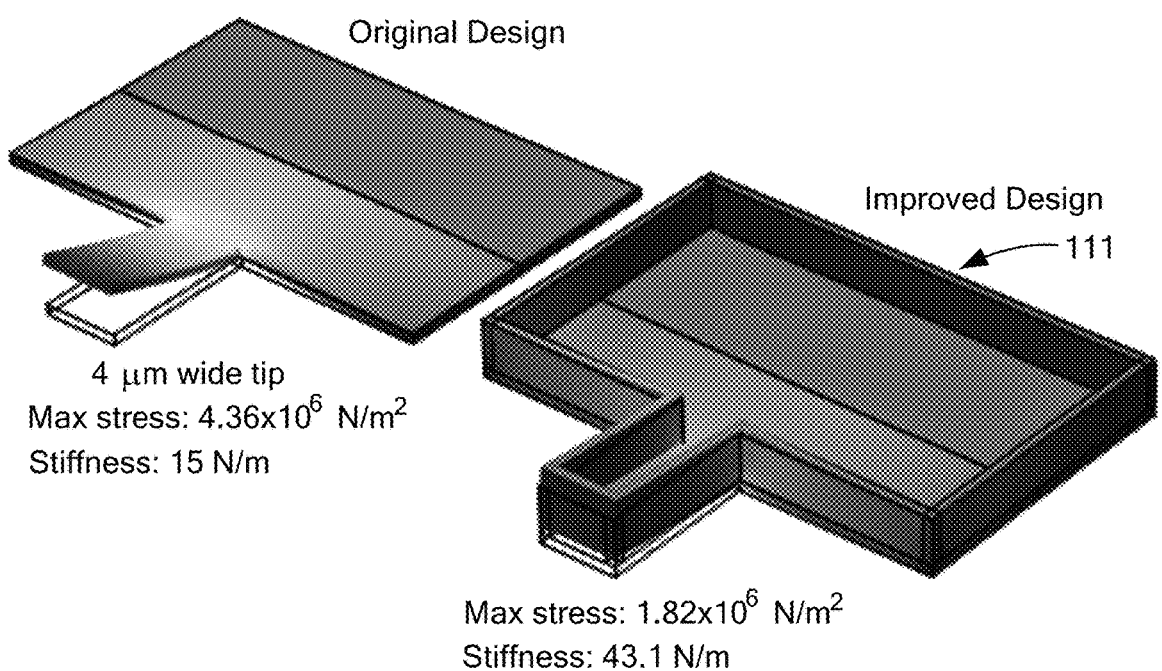
FIG. 11A shows simulation results for stress and stiffness in two contact element designs.
Figure 11B:
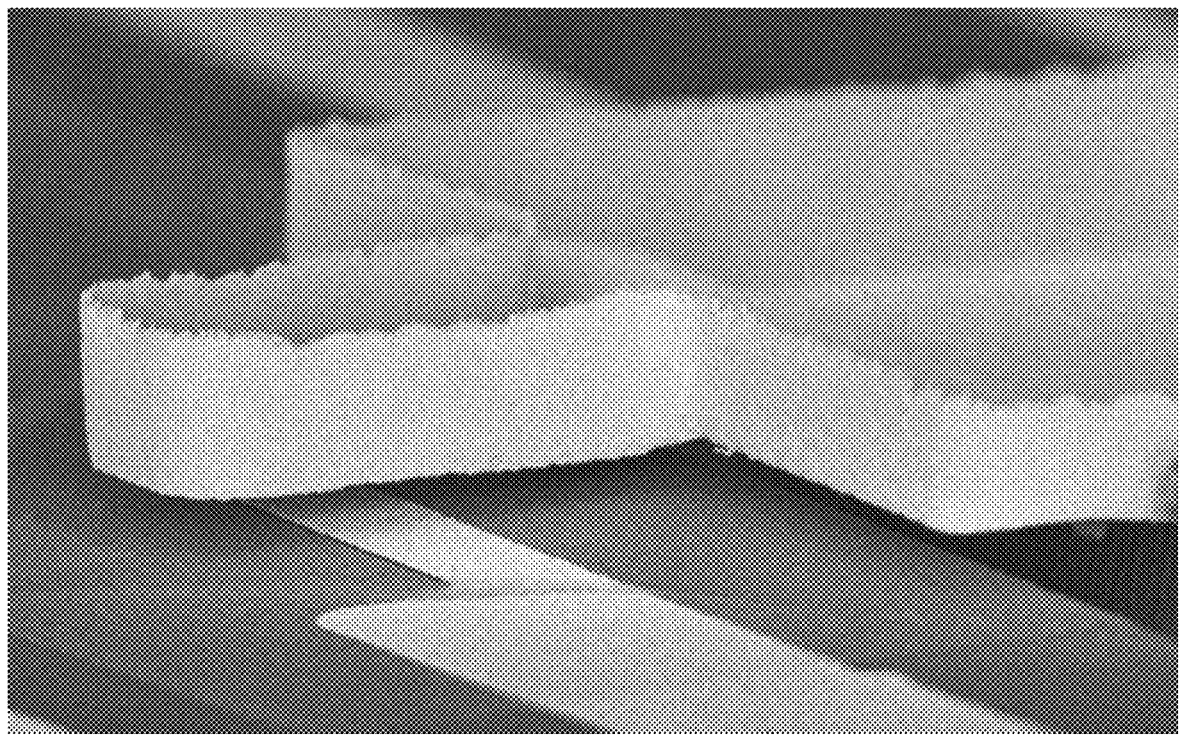
FIG. 11B is an SEM image of the improved design.

Due to the top contact being an important part of the switch that affects reliability, efforts were made to design a structurally strong top contact with a certain metal thickness. This was determined within the limit imposed by the deposition tool used (~500 nm). The improved design shown in FIG. 11A, right side, employed a unique 3-dimensional bowl-shaped top contact structure (111) that was estimated to have 3 times the stiffness of the previously designed flat switch ("original design" at left side of FIG. 11A) and 2.4-fold less maximum stress for the same applied upward force. FIG. 11B shows an SEM image of a fabricated 3D bowl-shaped switch. In practice, the bowl-shaped design has proved to be extremely resilient and has provided switching reliability of hundreds of cycles.

Example 3. Properties of an IR Plasmonic Absorber

The present PMR devices incorporate a plasmonic absorber that provides the spectral selectivity required to distinguish between different wavelengths of incoming IR or other radiation. The key goal of the plasmonic absorber design is to have a high absorption percentage within a narrow range of wavelengths, while reflecting other wavelengths.

Figure 12A:
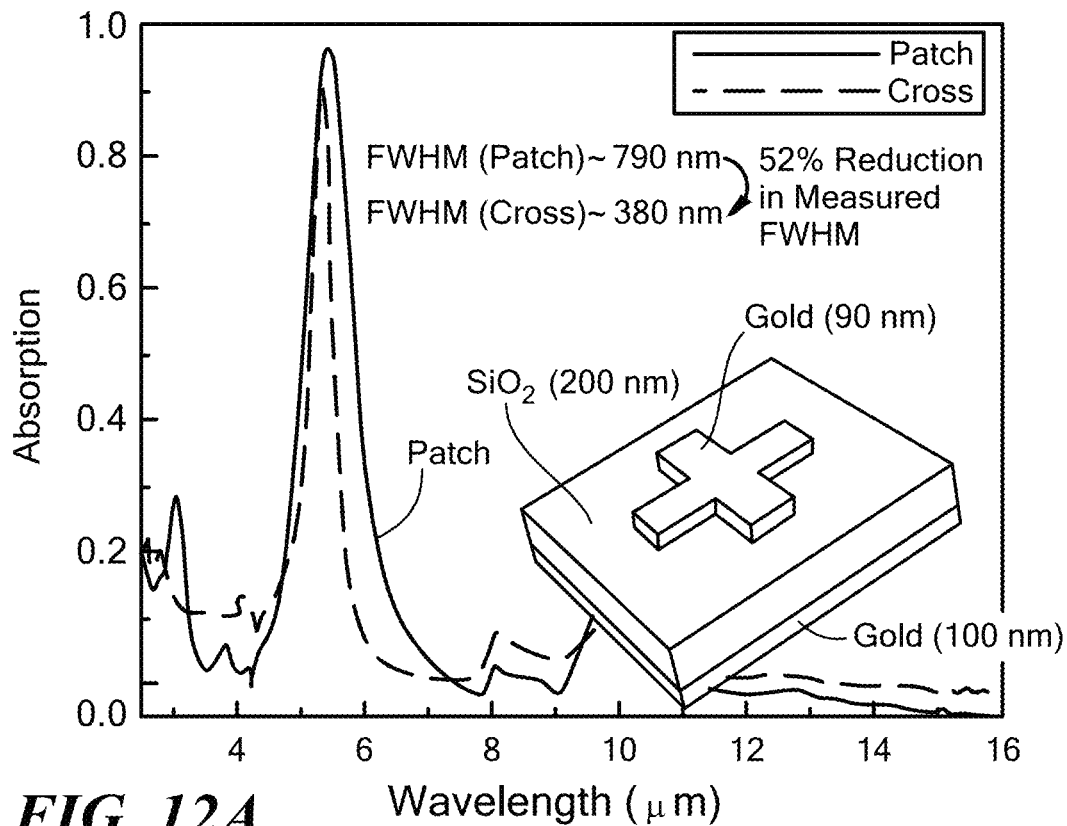
FIG. 12A shows a comparison of IR absorbance for plasmonic absorbers using square vs. cross-shaped patterns.

The designed and fabricated plasmonic absorbers were measured to have a consistently high absorption of >85% with a bandwidth of <380 nm. The core structure of the absorber consists of periodic square or cross patterns of gold on a thin (~200 nm) $SiO_2$ layer with a gold reflector underneath as shown in the inset of FIG. 12A. In FIG. 12A, the wavelength dependence of absorbance is shown for a patch pattern compared with a cross-shaped pattern.

Figure 12B:
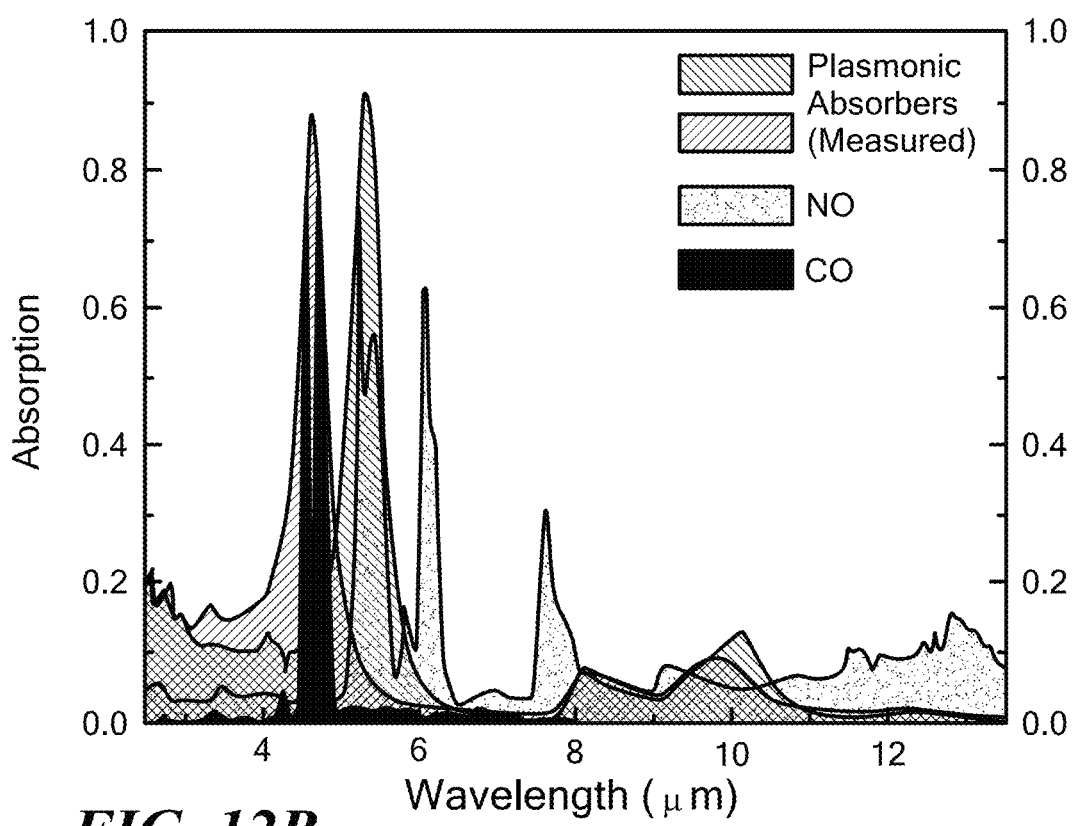
FIG. 12B shows IR absorption spectra for plasmonic absorbers tuned to absorption of NO and CO gasses.

Lithographic tuning to vary the size and/or periodicity of gold patterns of the plasmonic absorbers enables the tuning of the absorption band to a wavelength range of choice. Since one objective was to target emission wavelengths of particular gases, different absorbers were fabricated that corresponded to emission peaks of different gases. FIG. 12B shows an FT-I R measurement of two absorbers tuned to two different wavelengths, corresponding to absorption peaks of nitric oxide (NO) and carbon monoxide (CO), using cross patterns. It is noted that the cross pattern provided about half the bandwidth of the square pattern as seen in FIG. 12A.

Example 4. Zero Power Detection of IR

Figure 13:
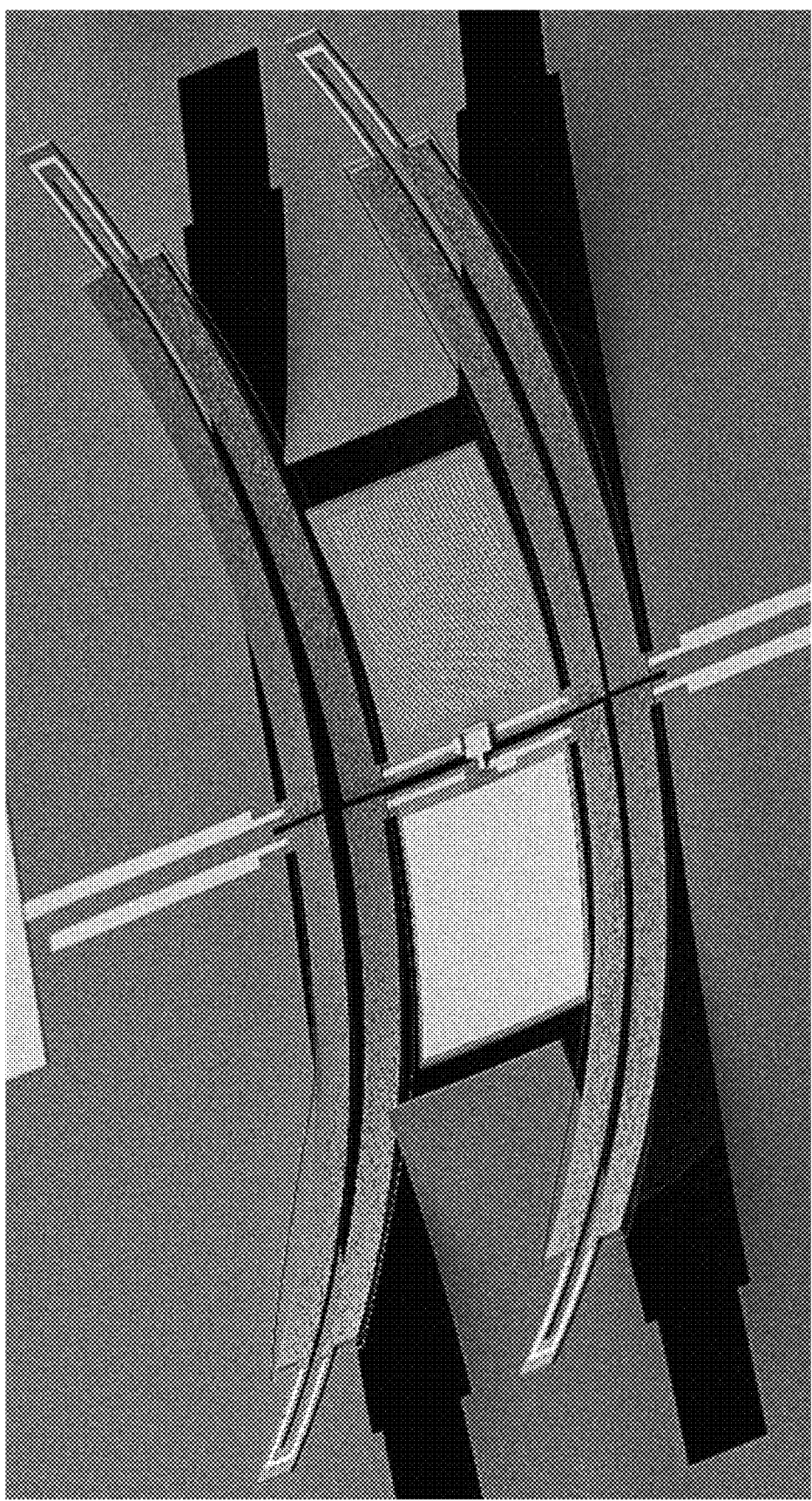
FIG. 13 shows an SEM image of a PMR device.
Figure 14:
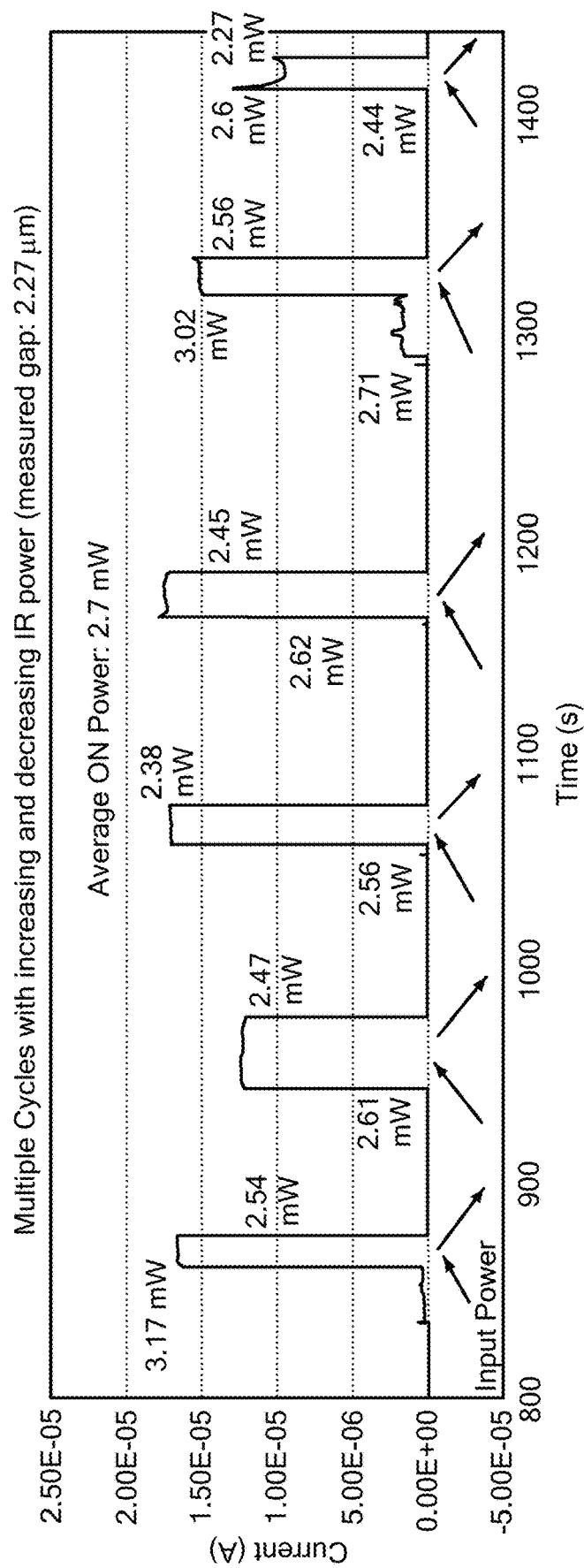
FIG. 14 shows results of varying IR input power.

IR radiation of a defined wavelength was detected while consuming 0 watts of power. The device had a plasmonic absorber (square type) that was tuned to 5 µm wavelength with 90% absorption. By using a quantum cascade laser (QCL) as the radiation source, the device was able to turn ON for an input IR power of 2.7 mW in air and had a contact gap of 2.3 µm. The device has an absorber area of 120 µm×130 µm and was designed to turn ON for an input power of 1 µW in vacuum ($10^{-5}$ Torr). FIG. 13 shows an SEM image of the tested device; the stress/temperature compensation is clearly seen to be effective. FIG. 14 shows a few cycles of the switching when input IR power was increased and decreased. The device was biased at 0.05 V, implying an ON resistance of ~3.3 kΩ, which matched the expected value. The ON power and the OFF power were different as expected due to adhesion. This hysteresis, the gap size, and stiffness of the structure were used to effectively measure the adhesion force.

The stiffness of the structure was ~50 nN/µm, which resulted in an extracted adhesion force of just 8.58 nN. This exceeded initial expectations of ~10 nN and therefore suggests that device sensitivity can be <100 nW in vacuum. As a control, the same experiment was done using a similar device on a different chip, where the device had no plasmonic absorber pattern. As expected, IR radiation did not turn ON the device even at >20 mW of power.

Figure 15:
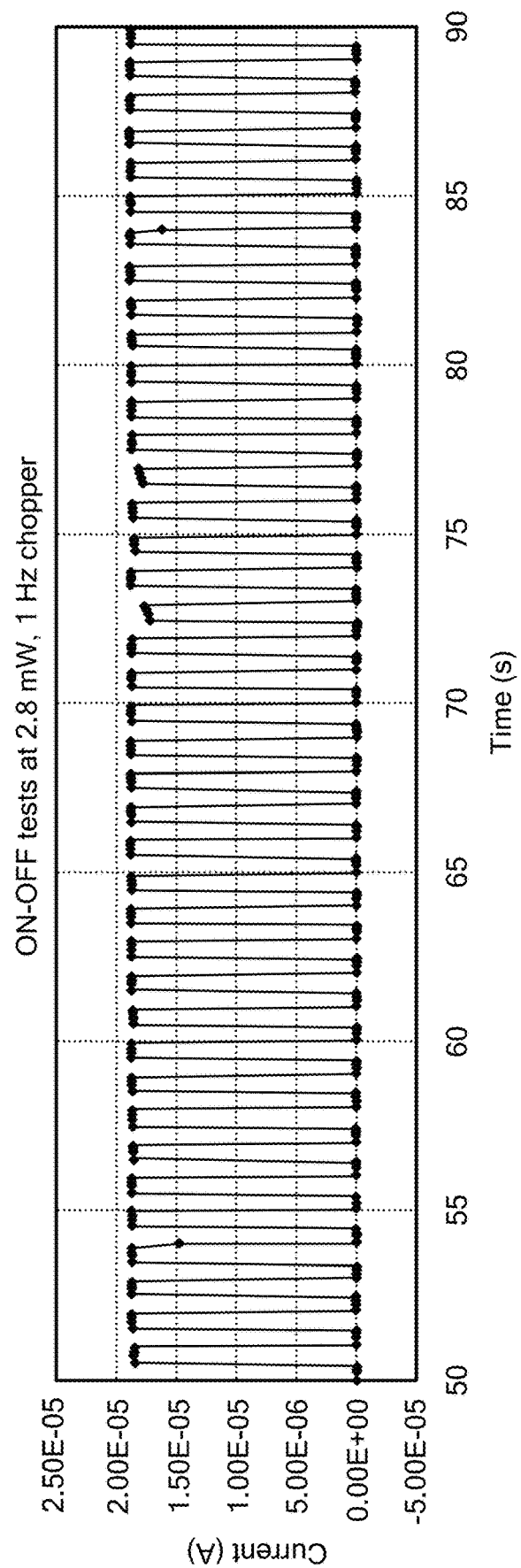
FIG. 15 shows results of repeated cycling of a PMR device.

A reliability test also was performed by providing a constant input IR power of 2.8 mW (just above threshold) which was chopped at 1 Hz for >350 cycles. The device was completely functional at the end of the experiment. FIG. 15 shows a part of the reliability test, demonstrating the repeatability of the detection.

Example 5. Electrothermally-Actuated Switches

Figure 16A:
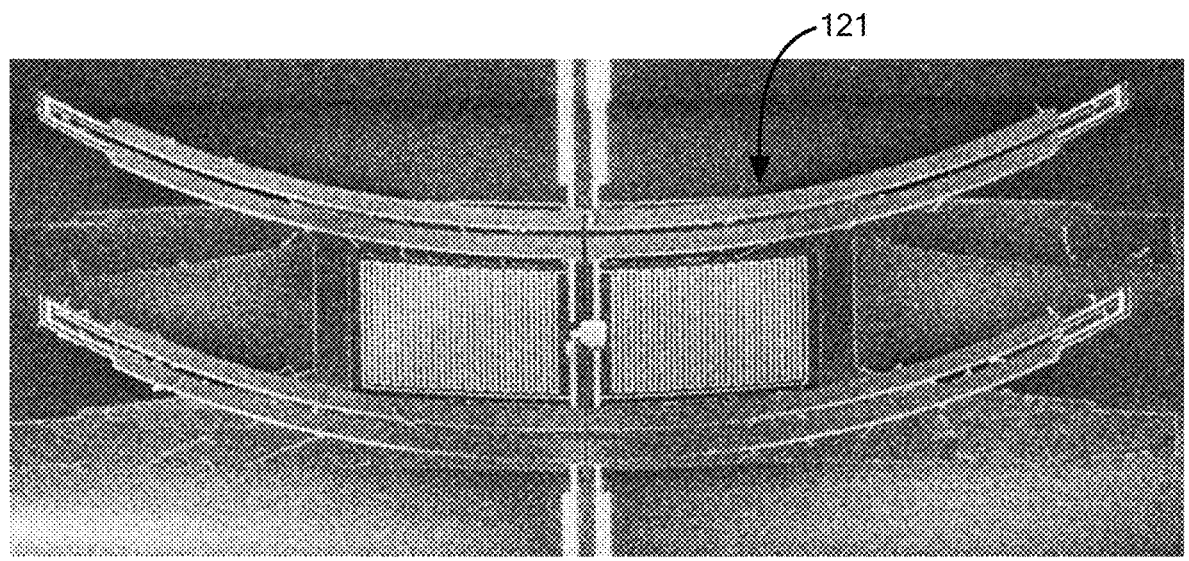
FIG. 16A shows an SEM image of an electrothermal microelectromechanical relay.
Figure 16B:
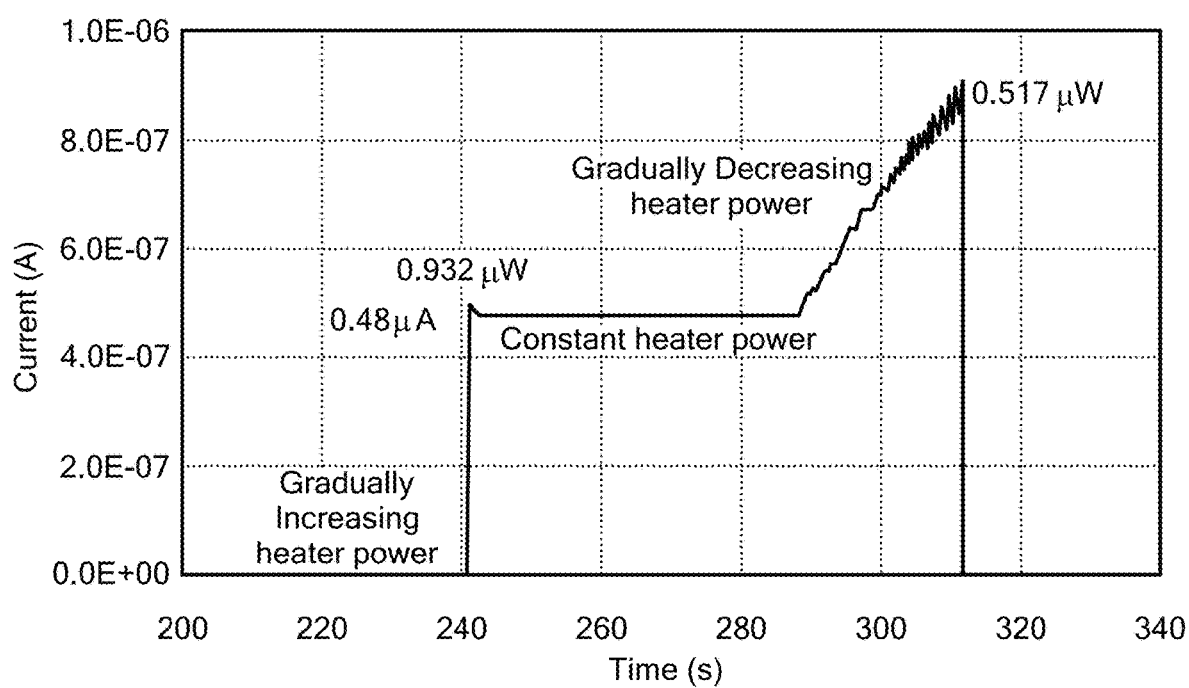
FIG. 16B shows switching characteristics of the relay of FIG. 16A.
Figure 17A:
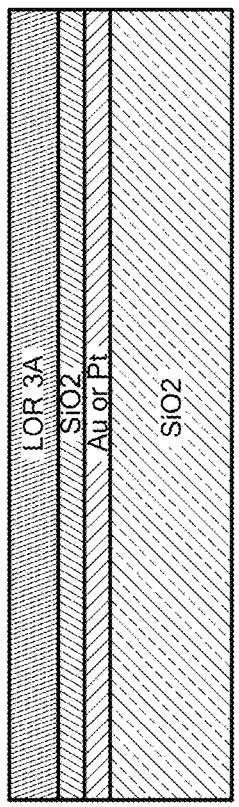
FIGS. 17A-17F illustrate steps of a process for preparing a microelectromechanical relay device including a plasmonic absorber.
Figure 17B:
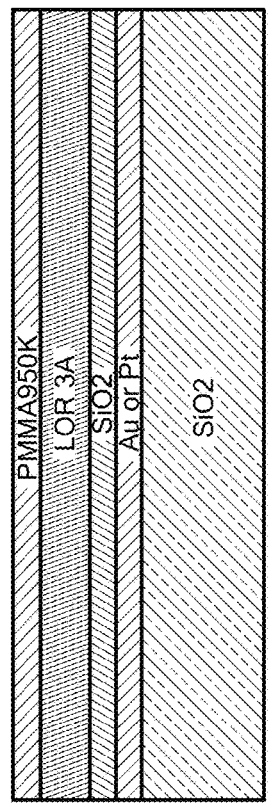
Figure 17C:
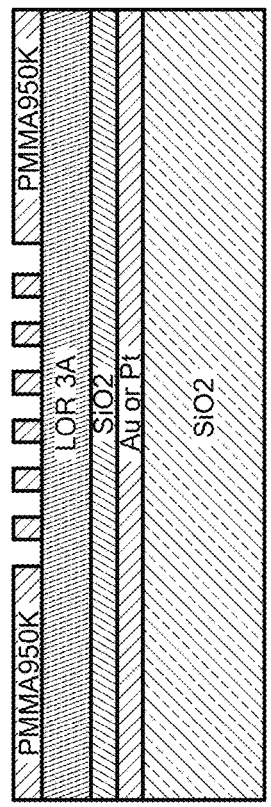
Figure 17D:
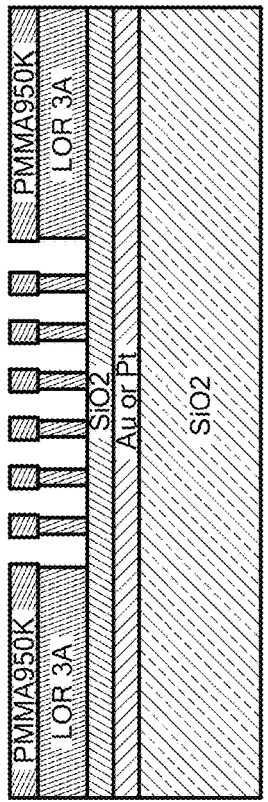
Figure 17E:
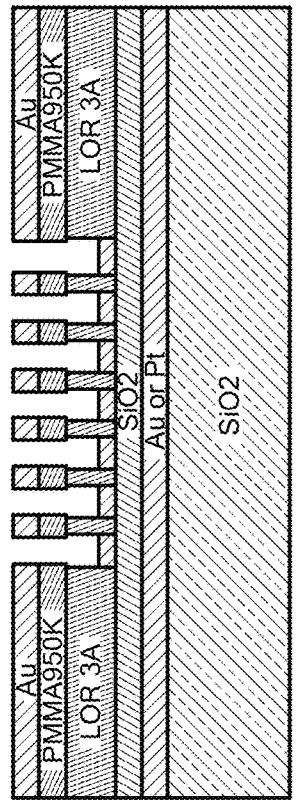
Figure 17F:
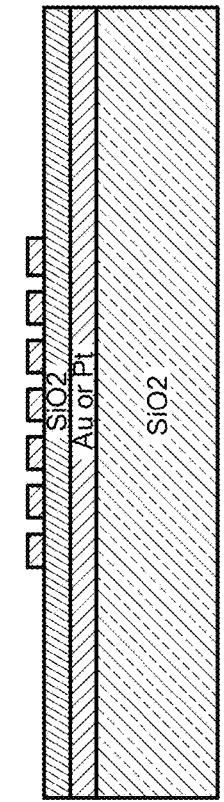

Since the detection mechanism involves the temperature rise of one head, an electric heater (121) can be integrated on the absorber side instead of a plasmonic surface. This was experimentally demonstrated as an electrothermally actuated switch both in air and vacuum. Incorporating the heater on the same design as shown previously, a turn ON power of 0.932 µW was measured in vacuum ($10^{-5}$ Torr) with a similar adhesion of just 10.9 nN. FIG. 16A shows one such heater-actuated design, and FIG. 16B shows a typical ON-OFF cycle when increasing and decreasing power (voltage input) to the heater.

The same devices were actuated in air and were measured to turn ON for ~350 µW, as expected due to the much larger thermal conduction and losses due to air. Thus, low power thermally actuated switches can be made with low adhesion and immunity to temperature changes.

Example 6. Fabrication of an IR-Sensitive PMR

1. Silicon dioxide ($SiO_2$) was deposited on a blank 4-inch silicon wafer as a 1.9 µm thick layer by plasma-enhanced chemical vapor deposition (PECVD).
2. Next, the metallic base layer was deposited and patterned on the cantilever heads. 10 nm titanium (Ti), 100 nm of platinum (Pt) or gold (Au), and 10 nm titanium were deposited by e-beam evaporation and patterned by LOR assisted lift-off. Ti layers were used to promote the adhesion between adjacent materials. (1st mask)
3. A second $SiO_2$ deposition was performed for the insulating layer between metallic base layer and future patterned metallic structures. A 100 nm thick $SiO_2$ layer was deposited by PECVD.
4. A second metal deposition and patterning was carried out for the electrical routing (also to make resistive heaters for electrothermal relays). 20 nm Ti and 20 nm Pt were deposited by e-beam evaporation and patterned by LOR assisted lift-off. The Pt layer was used to protect the Ti layer during the future xenon difluoride (XeF$_2$) isotropic dry release of the device. (2nd mask)

5. A third metal deposition and patterning was performed to form the contact base (bottom contact). 5 nm Ti and 100 nm Pt were deposited by e-beam evaporation and patterned by LOR assisted lift-off. (3rd mask)

6. Aluminum (Al) deposition and patterning was performed next. 500 nm Al was deposited by sputtering and patterned by wet etch. The wet etch only removed Al in the field (outside of bimaterial legs), leaving the Al on the area of bimaterial legs untouched for the future Al and SiO$_2$ co-etch. (4th mask)

7. Gold (Au) deposition and patterning was carried out to create the reflector on cantilever heads and probing pads. 5 nm Ti and 150 nm Au were deposited by e-beam evaporation and patterned by lift-off. (5th mask)

8. A second Au deposition and patterning was done with e-beam lithography to create the plasmonic absorber. 5 nm Ti/50 nm Au/10 nm Pt were deposited by e-beam evaporation and patterned by e-beam lithography and LOR assisted lift-off. LOR used in the lift-off process created a discontinuity in the sidewall of the photoresist (PR) as shown in FIGS. 17A-17F, which helps in achieving a flat edge of Au patches. The flatness of Au patches on the edge effects the absorption properties of the plasmonic absorber. The thin Pt layer here is for the protection of the Au layer during the future XeF$_2$ release of the device. Steps (a)-(f) as shown in FIGS. 17A-17F were as follows: (a) LOR 3A was spin-coated at 4000 rpm and baked on a 200° C. hot plate for 5 minutes; (b) PMMA950K (diluted with thinner) was spin-coated at 5000 rpm and baked on a 180° C. hot plate for 90 seconds; (c) PMMA was exposed with electron beam, then the PMMA was developed in MIBK:IPA (1:3) solution for 1 minute; (d) LOR was etched with diluted AZ400K:DI (1:1) developer for 4-5 minutes, depending on the feature size; (e) Ti/Au/Pt was deposited by e-beam evaporation; and (f) sample was soaked in 1165 solution for lift-off.

Figure 18:
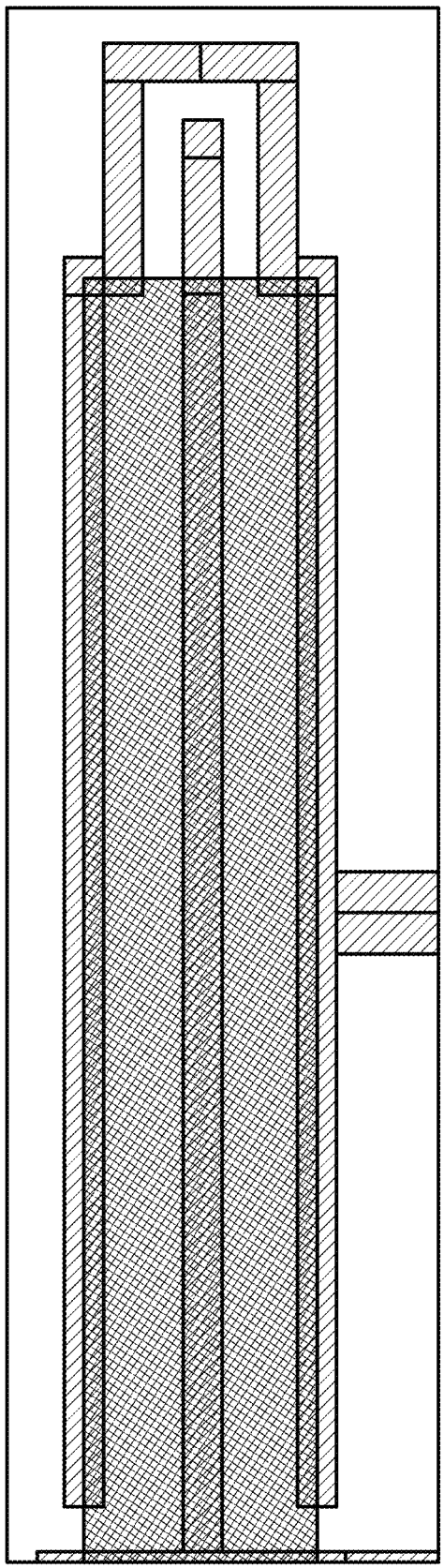
FIG. 18 shows overlapping masks for $SiO_2$ and Al layers of bimaterial legs of a PMR device.

9. Al and SiO$_2$ co-etch was then performed. The Al and SiO$_2$ layer was dry etched with the same mask to accurately define the size of bimaterial legs and device shape. This is important for the symmetry between the two pairs of bimaterial legs as the co-etch guarantees a self-alignment between Al and SiO$_2$. (6th mask) The pattern of Al and SiO$_2$ coherent dry etch (outer pattern shown in FIG. 18) is intentionally designed to overlap with the pattern of Al wet etch (inner pattern in FIG. 18). After the wet etch, the longitudinal edge of Al will be further defined by Al dry etch and followed by SiO$_2$ dry etch with a same mask (6th mask) to ensure a perfect alignment between Al and SiO$_2$ layers on the bimaterial legs.

10. Amorphous silicon (a-Si) deposition and patterning was carried out for the sacrificial layer between contact base (bottom contact) and contact tip (top contact). 500 nm a-Si was deposited by sputtering and patterned by dry etch. (7th mask)

Figure 19:
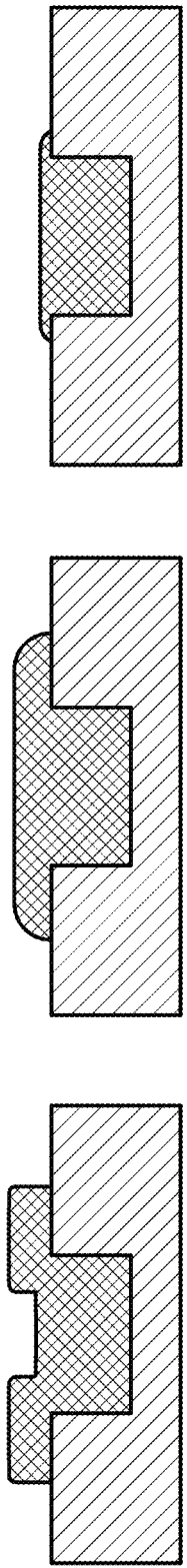
FIG. 19 shows steps of a photoresist plug shaping process for trench planarization in preparing a PMR device.
Figure 20A:
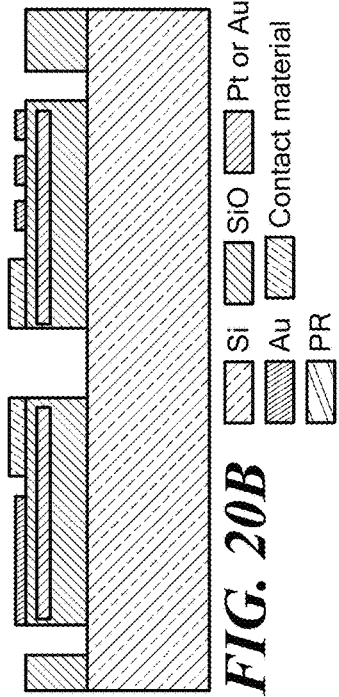
FIGS. 20A-20F show steps of preparing a contact tip for a PMR device.
Figure 20C:
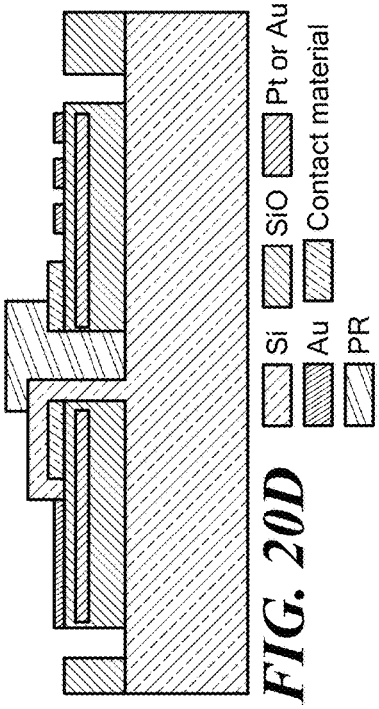
Figure 20E:
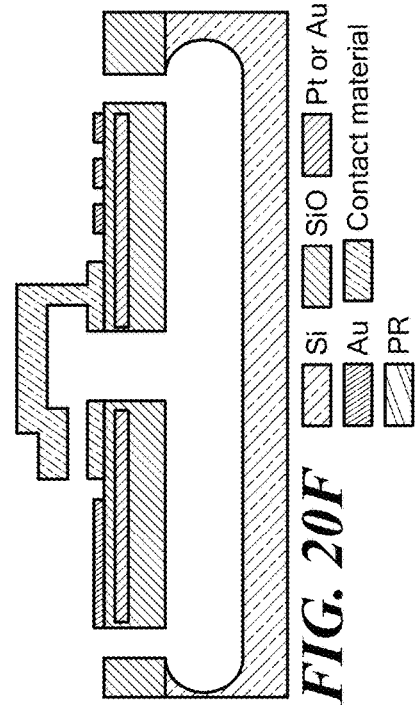
Figure 20B:
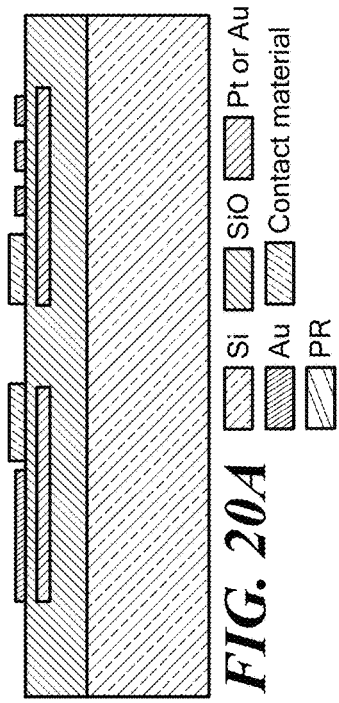
Figure 20D:
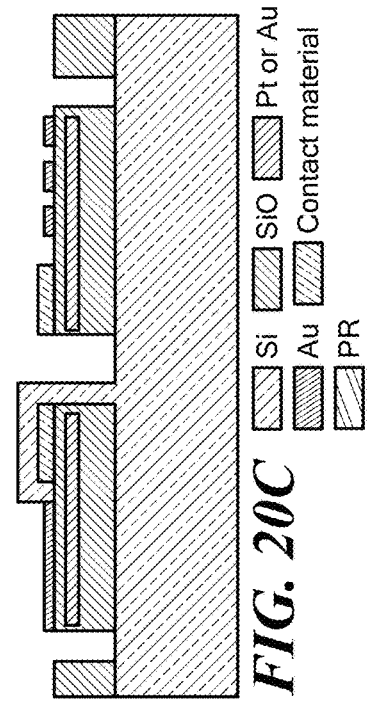
Figure 20F:
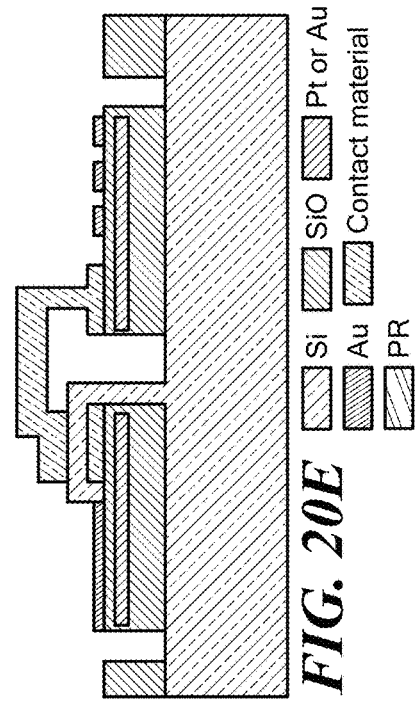

11. Shaping of the photoresist (PR) plug for trench planarization was carried out. 1.3 μm positive PR was spin-coated and patterned by photolithography inside the 2 μm deep trench. The patterned PR plug was further hard baked at 150 Celsius for at least 5 mins and thinned down by oxygen plasma etch. (8th mask) The profile of the plug during this process is depicted in FIG. 19.

12. Pt was deposited and patterned for the contact tips (top contact). 10 nm Ti and 450 nm Pt were deposited by sputtering and patterned by lift-off using 2.7 μm positive PR. It is important to use sputtering for the deposition of Pt as it gives a conformal coating across steps. The lift-off requires long time soaking in PR stripper and gentle cleaning of the metal residuals in order to achieve high yield of the bowl-shaped contact tips. (9th mask)

13. Finally, the wafer was diced and the devices released by Si isotropic etch with XeF$_2$.

The details of contact tip fabrication are shown in FIGS. 20A-20F. The structures shown are as follows: (a) cross section of two heads after fabrication process step 8; (b) step 9, Al dry etch and SiO$_2$ co-etch; (c) step 10, amorphous silicon (a-Si) deposition and patterning for the sacrificial layer; (d) step 11, shaping of photoresist (PR) plug for trench planarization; (e) step 12, Pt deposition and patterning for the contact tips; (f) device release.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

While the present invention has been described in conjunction with certain preferred embodiments, one of ordinary skill, after reading the foregoing specification, will be able to effect various changes, substitutions of equivalents, and other alterations to the compositions and methods set forth herein.

The invention claimed is:

1. A device comprising:
   a substrate, at least one electrical contact disposed on a surface of the substrate;
   a cantilever disposed on the substrate, the cantilever comprising a head, the head including a contact element disposed at a free end of the cantilever for movement into and out of electrical contact with the at least one electrical contact disposed on the surface of the substrate, and the contact element comprises a metal bowl-shaped structure comprising:
      a contact surface facing the at least one electrical contact disposed on the surface of the substrate,
      a central portion comprising an interior surface facing in a direction away from the at least one contact, and
      a peripheral portion extending from the interior surface in the direction facing away from the at least one electrical contact,
   wherein the central portion and the peripheral portion define an interior space of the bowl-shaped structure open in the direction facing away from the at least one electrical contact;
   wherein the cantilever further comprises an inner pair of temperature-sensitive bimaterial legs, and an outer pair of temperature-sensitive bimaterial legs, the inner pair of legs attached to opposite sides of the head, the outer pair of legs attached to the surface of the substrate and disposed adjacent to the inner pair of legs forming first and second sets of inner and outer legs, the first and second sets of legs disposed symmetrically on opposite sides of the head; and a first thermal isolation region connects the inner and outer legs of the first set of legs, and a second thermal isolation region connects the inner and outer legs of the second set of legs; and wherein the device is a microelectromechanical device, and the head has a microscale length and width and a nanoscale or microscale thickness.

2. The device of claim 1, wherein the central portion has a thickness of approximately 500 nm.

3. The device of claim 1, wherein the contact element includes an extending contact tip, the contact tip having a width of about 4 μm.

4. The device of claim 1, wherein the contact element has a stiffness greater than a stiffness of the cantilever.

5. The device of claim 1, wherein the contact element has a stiffness greater than 0.05 N/m.

6. The device of claim 1, wherein the contact element has a stiffness greater than 40 N/m.

7. The device of claim 1, wherein the contact element has a stiffness of about 0.05 N/m to about 1000 N/m.

8. The device of claim 1, wherein the contact element has a stiffness of about 40 N/m to about 1000 s of N/m.

9. The device of claim 1, wherein the head further comprises a metallic layer on the surface facing the surface of the substrate and an insulating layer on the metallic layer.

10. The device of claim 1, wherein the cantilever comprises a pair of bimaterial legs, each of the bimaterial legs comprises a stack of at least two materials having different thermal expansion coefficients, the legs providing compensation for ambient temperature changes.

11. The device of claim 1, wherein the at least one electrical contact comprises a source electrical contact or a drain electrical contact, and further comprising an additional electrical contact comprising the other of the source electrical contact and the drain electrical contract disposed on the surface of the substrate, the at least one electrical contact and the additional electrical contact separated by a gap; and the absorption of the electromagnetic radiation causes the contact element to move toward the source electrical contact and/or the drain electrical contact.

12. The device of claim 1, wherein the head further comprises a plasmonic absorber that absorbs electromagnetic radiation within a spectral band selected for detection, and the absorption of such electromagnetic radiation causes the contact element to move toward the electrical contact disposed on the surface of the substrate.

* * * * *